United States Patent
Moriyama et al.

(10) Patent No.: US 8,779,524 B2
(45) Date of Patent: Jul. 15, 2014

(54) SEMICONDUCTOR DEVICE

(75) Inventors: Yoshiya Moriyama, Toyama (JP);
Hiromasa Fujimoto, Toyama (JP);
Satoru Itou, Hyogo (JP); Susumu Akamatsu, Osaka (JP); Hiroshi Ohkawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/554,386

(22) Filed: Jul. 20, 2012

(65) Prior Publication Data
US 2012/0280328 A1 Nov. 8, 2012

Related U.S. Application Data

(63) Continuation of application No. PCT/JP2010/005081, filed on Aug. 17, 2010.

(30) Foreign Application Priority Data

Feb. 9, 2010 (JP) ................. 2010-026686

(51) Int. Cl.
*H01L 27/092* (2006.01)
*H01L 29/78* (2006.01)
*H01L 21/768* (2006.01)
*H01L 21/28* (2006.01)

(52) U.S. Cl.
CPC ...... *H01L 29/7843* (2013.01); *H01L 21/76895* (2013.01); *H01L 21/28123* (2013.01)
USPC .... 257/369; 257/368; 257/365; 257/E27.062; 438/199; 438/284

(58) Field of Classification Search
CPC ................. H01L 29/7843; H01L 21/28213; H01L 21/76895; H01L 21/823807; H01L 21/823842; H01L 21/823857; H01L 29/513; H01L 29/665; H01L 29/6659
USPC .......... 257/369, 368, 365, E27.062; 438/199, 438/284
See application file for complete search history.

(56) References Cited

U.S. PATENT DOCUMENTS

| | | | |
|---|---|---|---|
| 6,982,465 B2 * | 1/2006 | Kumagai et al. | 257/369 |
| 7,486,543 B2 * | 2/2009 | Kang et al. | 365/156 |

(Continued)

FOREIGN PATENT DOCUMENTS

| | | |
|---|---|---|
| JP | 06-021372 | 1/1994 |
| JP | 06-021372 A | 1/1994 |

(Continued)

OTHER PUBLICATIONS

International Search Report issued in International Patent Application No. PCT/JP2010/005081 dated Nov. 22, 2010.

*Primary Examiner* — Thinh T Nguyen
(74) *Attorney, Agent, or Firm* — McDermott Will & Emery LLP

(57) ABSTRACT

A semiconductor device includes a first-conductivity-type first MIS transistor and a second-conductivity-type second MIS transistor. The first and second MIS transistors include a first and a second gate insulating film formed on a first and a second active region surrounded by a separation region of a semiconductor substrate, and a first and a second gate electrode formed on the first and second gate insulating films. The first and second gate insulating films are separated from each other on a first separation region of the separation region. A distance s between first ends of the first and second active regions facing each other with the first separation region being interposed therebetween, and a protrusion amount d1 from the first end of the first active region to a first end of the first gate insulating film located on the first separation region establish a relationship d1<0.5s.

13 Claims, 19 Drawing Sheets

(56) References Cited

U.S. PATENT DOCUMENTS

| | | | |
|---|---|---|---|
| 7,528,451 B2 * | 5/2009 | Zhu et al. | 257/385 |
| 7,825,482 B2 * | 11/2010 | Okazaki et al. | 257/413 |
| 2006/0097294 A1 | 5/2006 | Yamashita et al. | |
| 2007/0018209 A1 * | 1/2007 | Sahara et al. | 257/288 |
| 2007/0267707 A1 | 11/2007 | Tsutsui | |
| 2008/0067611 A1 | 3/2008 | Kudo et al. | |
| 2008/0157215 A1 * | 7/2008 | Miyashita | 257/374 |
| 2008/0237749 A1 * | 10/2008 | Zhu et al. | 257/412 |
| 2009/0096032 A1 | 4/2009 | Saitoh et al. | |
| 2009/0212371 A1 | 8/2009 | Kobayashi | |
| 2009/0309165 A1 | 12/2009 | Ogawa et al. | |
| 2012/0280328 A1 * | 11/2012 | Moriyama et al. | 257/369 |

FOREIGN PATENT DOCUMENTS

| | | |
|---|---|---|
| JP | 11-126828 | 5/1999 |
| JP | 11-126828 A | 5/1999 |
| JP | 2009-194352 | 8/2009 |

\* cited by examiner

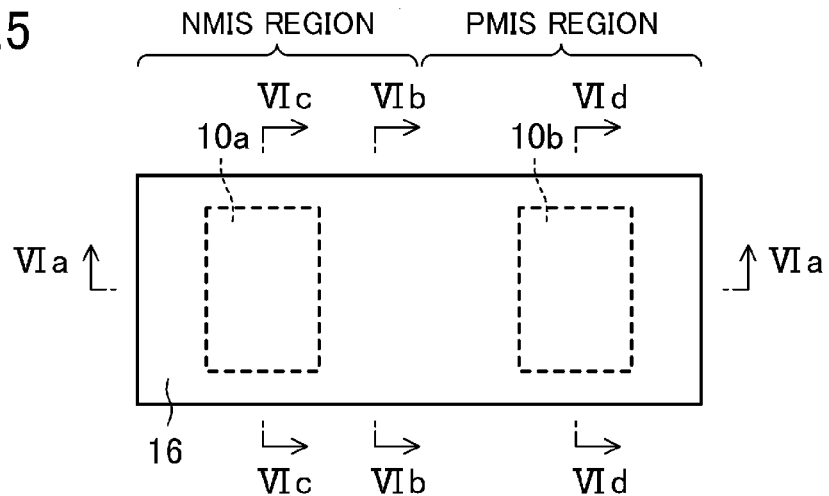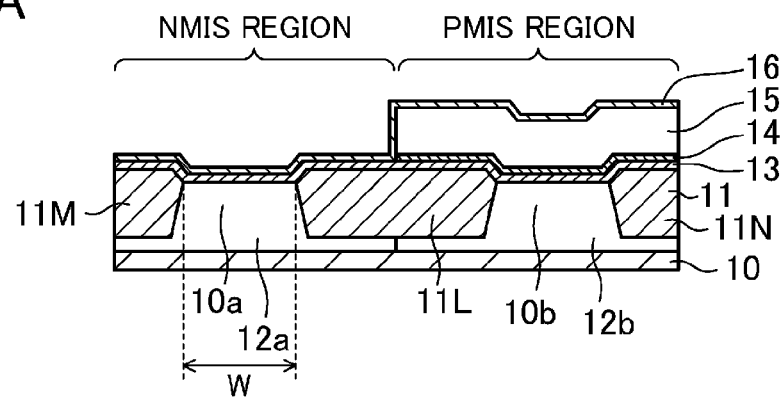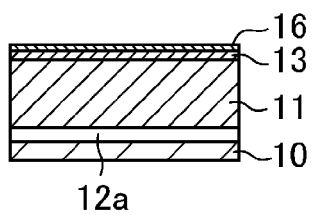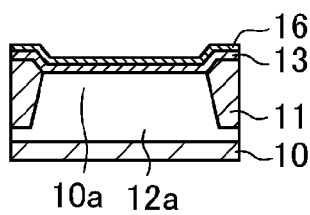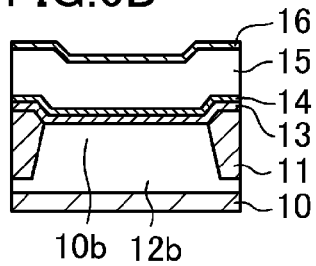

FIG.9
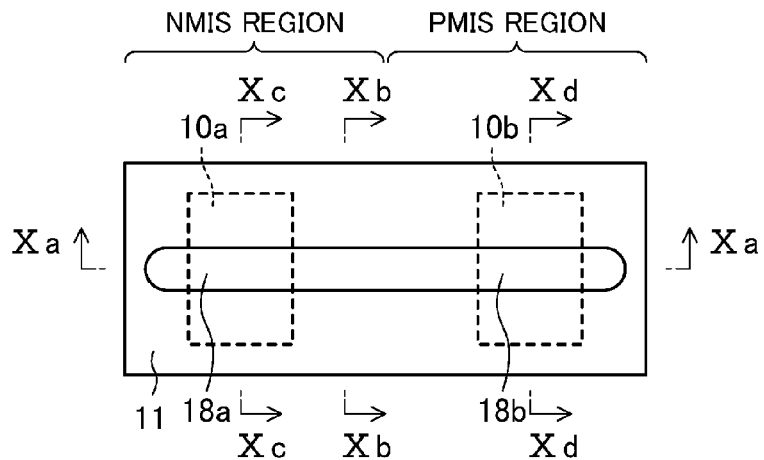
FIG.10A
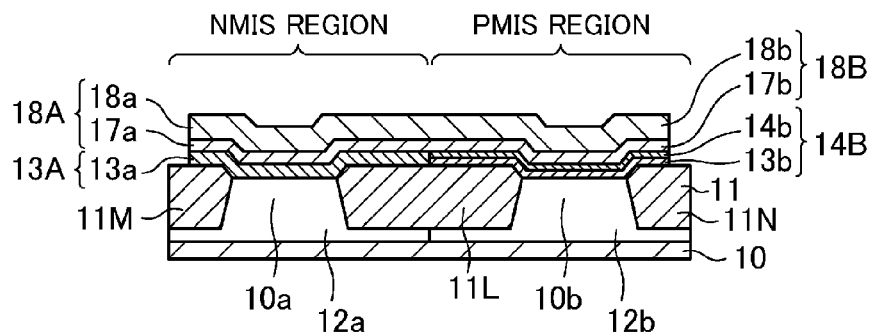
FIG.10B  FIG.10C  FIG.10D
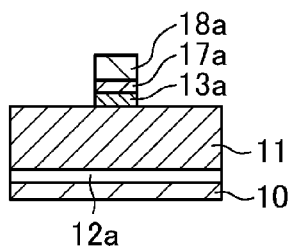 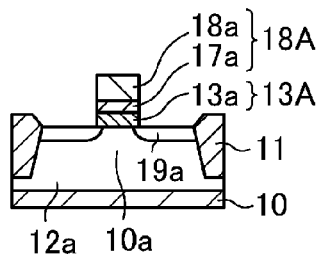 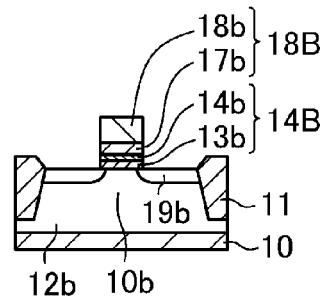

SEMICONDUCTOR DEVICE

CROSS-REFERENCE TO RELATED APPLICATIONS

This is a continuation of PCT International Application PCT/JP2010/005081 filed on Aug. 17, 2010, which claims priority to Japanese Patent Application No. 2010-026686 filed on Feb. 9, 2010. The disclosures of these applications including the specifications, the drawings, and the claims are hereby incorporated by reference in their entirety.

BACKGROUND

The present disclosure relates to semiconductor devices and methods for fabricating the semiconductor devices. More particularly, the present disclosure relates to a semiconductor device which includes a metal-insulator-semiconductor field-effect transistor (MISFET) including a gate insulating film including a high dielectric constant film (high-k film) containing a metal for adjustment, and a method for fabricating the semiconductor device.

In recent years, for the purpose of lower power consumption and higher speed of a semiconductor integrated circuit device, a semiconductor device has been proposed which includes a MISFET (hereinafter referred to as a "MIS transistor") including a high-k film (e.g., a hafnium (Hf)-based film etc.) as the gate insulating film and a metal film or metal film/silicon film as the gate electrode.

In n-type and p-type MIS transistors including, for example, a Hf-based film as the gate insulating film, even if the n-type and p-type MIS transistors have different materials for the metal films of the gate electrodes, the effective work functions of the n-type and p-type MIS transistors are in the vicinity of the mid-gap but not in the vicinity of the band edge, and therefore, the n-type and p-type MIS transistors disadvantageously have a high threshold voltage.

Therefore, an n-type MIS transistor has been proposed which includes a Hf-based film containing, for example, lanthanum (La) as the gate insulating film in order to shift the effective work function toward the band edge to reduce the threshold voltage (see, for example, Japanese Patent Publication No. 2009-194352).

The reason why the threshold voltage of the n-type MIS transistor can be reduced by employing the Hf-based film containing La as the gate insulating film is as follows. If the Hf-based film contains La, dipoles are generated in the Hf-based film. As a result, the flat-band voltage is shifted toward the negative region, so that the effective work function of the n-type MIS transistor is shifted toward the band edge, whereby the threshold voltage of the n-type MIS transistor can be reduced.

A configuration of a conventional semiconductor device will be described hereinafter with reference to FIGS. 31, 32A, and 32B. The conventional semiconductor device includes an n-type MIS transistor including a first gate insulating film including a first high-k film containing La, and a p-type MIS transistor, which are formed on the same semiconductor substrate. FIG. 31 is a plan view showing the configuration of the conventional semiconductor device. FIG. 32A is a cross-sectional view taken along the gate width direction showing the configuration of the conventional semiconductor device. FIG. 32B is a cross-sectional view taken along the gate length direction showing the configuration of the conventional semiconductor device. Specifically, FIGS. 32A and 32B are cross-sectional views taken along lines XXXIIa-XXXIIa and XXXIIb-XXXIIIb, respectively, of FIG. 31. In FIGS. 31 and 32A, an NMIS region is shown on the left side and a PMIS region is shown on the right side.

As shown in FIGS. 31 and 32A, the conventional semiconductor device includes an n-type MIS transistor nTr and a p-type MIS transistor pTr. A p-type well region 102a is formed in the NMIS region of the semiconductor substrate 100. On the other hand, an n-type well region 102b is formed in the PMIS region of the semiconductor substrate 100.

As shown in FIG. 32A, the n-type and p-type MIS transistors nTr and pTr include a first and a second gate insulating film 103A and 104B formed on a first and a second active region 100a and 100b, and a first and a second gate electrode 106A and 106B formed on the first and second gate insulating films 103A and 104B. The first gate insulating film 103A includes a first high-k film 103a containing La. The second gate insulating film 104B includes a second high-k film 103b and a second adjustment metal film 104b containing aluminum (Al). The first and second gate electrodes 106A and 106B include a first and a second metal film 105a and 105b and a first and a second silicon film 106a and 106b.

The first and second gate insulating films 103A and 104B are connected together on a first separation region 101L. The first and second gate electrodes 106A and 106B are connected together on the first separation region 101L. A contact plug 107 is formed on the first and second gate electrodes 106A and 106B, covering end portions of the first and second gate electrodes 106A and 106B. Here, the "first separation region 101L" is a portion of a separation region 101 located between the first and second active regions 100a and 100b.

As shown in FIG. 31, the separation region 101 is formed in an upper portion of the semiconductor substrate 100, surrounding the first and second active regions 100a and 100b. The first gate electrode 106A is formed on the first active region 100a with the first gate insulating film (103A in FIG. 32A) being interposed therebetween. The second gate electrode 106B is formed on the second active region 100b with the second gate insulating film (104B in FIG. 32A) being interposed therebetween. The contact plug 107 is formed on the first and second gate electrodes 106A and 106B.

As shown in FIG. 32B, the first high-k film 103a, the first metal film 105a, the first silicon film 106a, and the contact plug 107 are successively formed on the separation region 101.

Because the first gate insulating film 103A contains La, the effective work function of the n-type MIS transistor nTr can be shifted toward the band edge. Because the second gate insulating film 104B contains Al, the effective work function of the p-type MIS transistor pTr can be shifted toward the band edge.

As shown in FIG. 32A, a protrusion amount (d1) from a first end of the first active region 100a to a first end of the first gate insulating film 103A and a protrusion amount (d2) from a first end of the second active region 100b to a first end of the second gate insulating film 104B are designed to be equal to each other (d1=d2).

SUMMARY

The present inventors have intensively studied the n-type MIS transistor including the gate insulating film including a high-k film containing an adjustment metal (e.g., La etc.) to find the following novel problem.

For further miniaturization of a semiconductor device, the gate width needs to be reduced. However, in an n-type MIS transistor which includes a gate insulating film including a high-k film containing an adjustment metal, the threshold voltage disadvantageously increases with a decrease in the gate width.

This problem will be described with reference to FIG. 33. FIG. 33 is a graph showing a relationship between the gate width and the threshold voltage.

The threshold voltage was measured where the protrusion amount (see d1 in FIG. 32A) from one end of the active region to one end of the gate insulating film was constant, and the gate width (see W in FIG. 32A) was varied. The result is shown in FIG. 33.

As indicated by a solid line in FIG. 33, a threshold voltage value Vthh where the gate width is Wh is higher than a threshold voltage value Vthl where the gate width is Wl (Wl>Wh) (Vthh>Vthl).

As indicated by a dashed line in FIG. 33, the threshold voltage value where the gate width is Wh is ideally equal to the threshold voltage where the gate width is Wl. In other words, it is an ideal that the threshold voltage does not increase even when the gate width is decreased. However, as indicated by the solid line in FIG. 33, the threshold voltage increases with a decrease in the gate width.

On the other hand, the present inventors have studied a p-type MIS transistor including a gate insulating film having a high-k film and an adjustment metal film containing an adjustment metal (e.g., Al etc.) to find the following result.

In the p-type MIS transistor, the rate of the increase of the threshold voltage with a decrease in the gate width is considerably low, compared to the n-type MIS transistor. In other words, in the p-type MIS transistor, the threshold voltage does not increase significantly with a decrease in the gate width.

The present disclosure describes implementations of a semiconductor device including a first MIS transistor including a first gate insulating film including a first high-k film containing a first adjustment metal, and a second MIS transistor, in which the increase in the threshold voltage of the first MIS transistor is reduced or prevented.

A semiconductor device according to an aspect of the present disclosure includes a first MIS transistor of a first conductivity type and a second MIS transistor of a second conductivity type. The first MIS transistor includes a first gate insulating film including a first high-k film formed on a first active region surrounded by a separation region of a semiconductor substrate, and a first gate electrode formed on the first gate insulating film. The second MIS transistor includes a second gate insulating film including a second high-k film formed on a second active region surrounded by the separation region of the semiconductor substrate, and a second gate electrode formed on the second gate insulating film. The first and second gate insulating films are separated from each other on a first separation region of the separation region located between the first and second active regions. The first and second active regions are adjacent to each other in a gate width direction with the first separation region being interposed between the first and second active regions. A distance s between first ends of the first and second active regions facing each other with the first separation region being interposed between the first ends of the first and second active regions, and a protrusion amount d1 from the first end of the first active region to a first end of the first gate insulating film located on the first separation region establish a relationship d1<0.5s.

According to the semiconductor device of the aspect of the present disclosure, the relationship d1<0.5s is established. Therefore, the amount of the first gate insulating film which contacts the first separation region can be reduced. Therefore, for example, in a thermal treatment, the amount of oxygen (O) supplied from the separation region to the first high-k film (particularly, a portion of the first high-k film which contacts the first active region) can be reduced, whereby neutralization of dipoles caused by reaction of the oxygen (O) with the first adjustment metal (e.g., La) contained in the first high-k film can be reduced. Therefore, even if the gate width is reduced by miniaturization of the semiconductor device, the increase in the threshold voltage of the first MIS transistor can be reduced or prevented.

In the semiconductor device of the aspect of the present disclosure, a relationship $d1 \leq 0.5(s-h)$ is preferably established, where h is a distance between the first end of the first gate insulating film and a first end of the second gate insulating film located on the first separation region.

In the semiconductor device of the aspect of the present disclosure, a following relationship d1<d2 is preferably established, where d2 is a protrusion amount from the first end of the second active region to a first end of the second gate insulating film located on the first separation region.

In the semiconductor device of the aspect of the present disclosure, a relationship $d3 \leq d1$ is preferably established, where d3 is a protrusion amount from a second end of the first active region to a second end of the first gate insulating film located on a second separation region of the separation region.

Thus, the relationship d3<d1 is established. Therefore, the amount of the first gate insulating film which contacts the second separation region can be reduced. Therefore, for example, in a thermal treatment, the amount of oxygen (O) supplied from the separation region to the first high-k film can be reduced, whereby neutralization of dipoles caused by reaction of the oxygen (O) with the first adjustment metal contained in the first high-k film can be reduced. Therefore, even if the gate width is reduced by miniaturization of the semiconductor device, the increase in the threshold voltage of the first MIS transistor can be reduced or prevented.

In the semiconductor device of the aspect of the present disclosure, a relationship $d4 \leq d2$ is preferably established, where d2 is a protrusion amount from the first end of the second active region to a first end of the second gate insulating film located on the first separation region, and d4 is a protrusion amount from a second end of the second active region to a second end of the second gate insulating film located on a third separation region of the separation region.

In the semiconductor device of the aspect of the present disclosure, the first and second gate electrodes are preferably separated from each other on the first separation region. The semiconductor device preferably further includes a contact plug formed on the first separation region, covering end portions of the first and second gate electrodes.

In the semiconductor device of the aspect of the present disclosure, the first MIS transistor is preferably an n-type MIS transistor. The second MIS transistor is preferably a p-type MIS transistor.

In the semiconductor device of the aspect of the present disclosure, the first gate insulating film preferably contains a first adjustment metal, and the second gate insulating film preferably does not contain the first adjustment metal.

In the semiconductor device of the aspect of the present disclosure, the first adjustment metal is preferably La.

In the semiconductor device of the aspect of the present disclosure, the second gate insulating film preferably contains a second adjustment metal, and the first gate insulating film preferably does not contain the second adjustment metal.

In the semiconductor device of the aspect of the present disclosure, the second adjustment metal is preferably Al.

In the semiconductor device of the aspect of the present disclosure, the first gate electrode preferably includes a first metal film formed on the first gate insulating film, and a first silicon film formed on the first metal film. The second gate electrode preferably includes a second metal film formed on the second gate insulating film, and a second silicon film formed on the second metal film.

The semiconductor device of the aspect of the present disclosure preferably further includes a first sidewall formed on a side surface in a gate length direction of the first gate electrode, and a second sidewall formed on a side surface in the gate length direction of the second gate electrode. The first sidewall is preferably not formed on a side surface in the gate width direction of the first gate electrode. The second sidewall is preferably not formed on a side surface in the gate width direction of the second gate electrode.

The semiconductor device of the aspect of the present disclosure preferably further includes a sidewall having a U-shaped cross-section formed on the first separation region between the first and second gate electrodes.

A method for fabricating a semiconductor device according to an aspect of the present disclosure is a method for fabricating a semiconductor device including a first MIS transistor of a first conductivity type formed on a first active region of a semiconductor substrate, and a second MIS transistor of a second conductivity type formed on a second active region of the semiconductor substrate. The method includes step (a) of forming a separation region which separates the first and second active regions of the semiconductor substrate from each other, step (b) of forming a first gate insulating film formation film including a first high-k film formed on the first active region, and a second gate insulating film formation film including a second high-k film formed on the second active region, step (c) of forming a gate electrode formation film on the first and second gate insulating film formation films, and step (d) of patterning the gate electrode formation film and the first and second gate insulating film formation films to form a first gate insulating film formed of the first gate insulating film formation film and a first gate electrode formed of the first gate electrode formation film on the first active region, and a second gate insulating film formed of the second gate insulating film formation film and a second gate electrode formed of the second gate electrode formation film on the second active region. In step (d), the first and second gate insulating films are separated from each other on a first separation region of the separation region located between the first and second active regions. A distance s between first ends of the first and second active regions facing each other with the first separation region being interposed between the first ends of the first and second active regions, and a protrusion amount d1 from the first end of the first active region to a first end of the first gate insulating film located on the first separation region establish a relationship d1<0.5s.

According to the semiconductor device fabricating method of the aspect of the present disclosure, the relationship d1<0.5s is established. Therefore, the amount of the first gate insulating film which contacts the first separation region can be reduced. Therefore, for example, in a thermal treatment, the amount of oxygen (O) supplied from the separation region to the first high-k film (particularly, a portion of the first high-k film which contacts the first active region) can be reduced, whereby neutralization of dipoles caused by reaction of the oxygen (O) with the first adjustment metal (e.g., La) contained in the first high-k film can be reduced. Therefore, even if the gate width is reduced by miniaturization of the semiconductor device, the increase in the threshold voltage of the first MIS transistor can be reduced or prevented.

In the semiconductor device fabricating method of the aspect of the present disclosure, step (b) preferably includes step (b1) of forming a high-k film on the first and second active regions, step (b2) of forming a second adjustment metal film on a second portion located on the second active region of the high-k film, and step (b3) of introducing a first adjustment metal into a first portion located on the first active region of the high-k film. The first gate insulating film formation film preferably includes a first high-k film containing the first adjustment metal. The second gate insulating film formation film preferably includes a second high-k film which does not contain the first adjustment metal, and a second adjustment metal film.

In the semiconductor device fabricating method of the aspect of the present disclosure, step (d) preferably includes step (d1) of patterning the gate electrode formation film and the first and second gate insulating film formation films to form the first and second gate insulating films contacting each other on the first separation region, and the first and second gate electrodes, and step (d2) of, after step (d1), patterning the first gate electrode and the first gate insulating film to remove the first gate insulating film from the first separation region, whereby the first and second gate insulating films are separated from each other on the first separation region.

As described above, according to the semiconductor device of the aspect of the present disclosure and the fabrication method thereof, even if the gate width is reduced by miniaturization of the semiconductor device, the increase in the threshold voltage of the first MIS transistor can be reduced or prevented.

BRIEF DESCRIPTION OF THE DRAWINGS

FIG. 5 is a plan view showing a method for fabricating the semiconductor device of the first embodiment of the present disclosure.

FIGS. 6A-6D are cross-sectional views showing the method for fabricating the semiconductor device of the first embodiment of the present disclosure.

FIG. 9 is a plan view showing the method for fabricating the semiconductor device of the first embodiment of the present disclosure.

FIGS. 10A-10D are cross-sectional views showing the method for fabricating the semiconductor device of the first embodiment of the present disclosure.

DETAILED DESCRIPTION

Figure 1A:
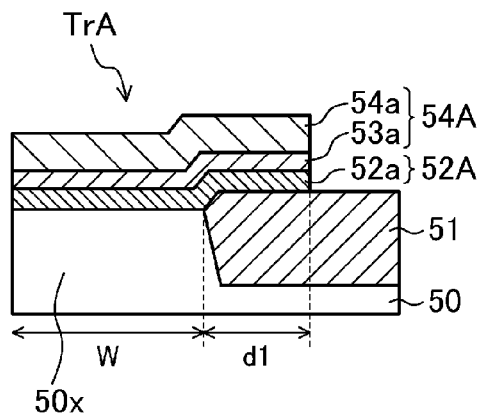
FIG. 1A is a cross-sectional view taken along the gate width direction showing a configuration of a semiconductor device according to a first example.
Figure 1B:
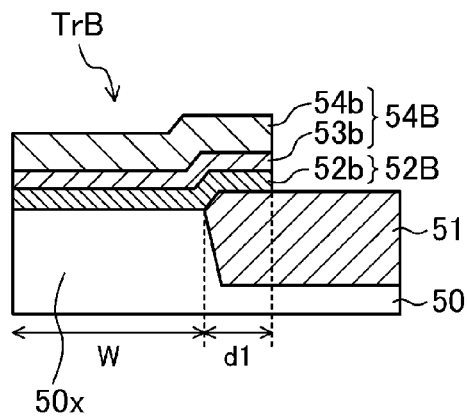
FIG. 1B is a cross-sectional view taken along the gate width direction showing a configuration of a semiconductor device according to a second example.
Figure 2:
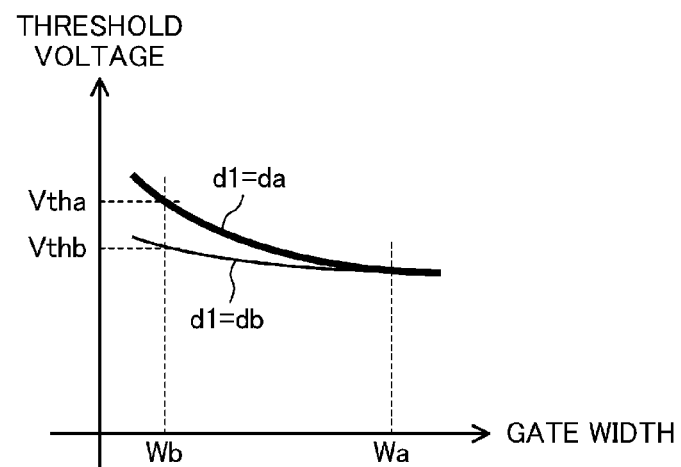
FIG. 2 is a graph showing a relationship between the gate width and the threshold voltage.

The present inventors have further intensively studied the above novel problem which was found by themselves to find the following. The finding will be described with reference to FIGS. 1A and 1B and 2. FIG. 1A is a cross-sectional view taken along the gate width direction showing a configuration of a semiconductor device according to a first example. FIG. 1B is a cross-sectional view taken along the gate width direction showing a configuration of a semiconductor device according to a second example. FIG. 2 is a graph showing a relationship between the gate width and the threshold voltage.

As shown in FIG. 1A, an n-type MIS transistor TrA is formed on an active region $50x$ of a semiconductor substrate 50 surrounded by a separation region 51. On the other hand, as shown in FIG. 1B, an n-type MIS transistor TrB is formed on an active region $50x$ of a semiconductor substrate 50 surrounded by a separation region 51.

The n-type MIS transistor TrA, TrB includes a gate insulating film 52A, 52B formed on the active region $50x$, and a gate electrode 54A, 54B formed on the gate insulating film 52A, 52B. The gate insulating film 52A, 52B includes a high-k film $52a$, $52b$ containing La. The gate electrode 54A, 54B includes a metal film $53a$, $53b$ and a silicon film $54a$, $54b$.

As shown in FIG. 1A, a protrusion amount d1 from a first end of the active region $50x$ to a first end of the gate insulating film 52A has a value da. On the other hand, as shown in FIG. 1B, a protrusion amount d1 from a first end of the active region $50x$ to a first end of the gate insulating film 52B has a value db (db<da).

The threshold voltage of the n-type MIS transistor TrA of FIG. 1A was measured while varying the gate width W. In other words, the threshold voltage was measured while varying the gate width W, where the protrusion amount d1 had the value da (constant). The result is shown by a thick line in FIG. 2.

On the other hand, the threshold voltage of the n-type MIS transistor TrB of FIG. 1B was measured while varying the gate width W. In other words, the threshold voltage was measured while varying the gate width W, where the protrusion amount d1 had the value db (constant). The result is shown by a thin line in FIG. 2.

As shown in FIG. 2, when the gate width W is Wa (in other words, the gate width W is relatively broad), a threshold voltage value where the protrusion amount d1 is da and a threshold voltage value where the protrusion amount d1 is db are the same.

On the other hand, as shown in FIG. 2, the gate width W is Wb (in other words, the gate width W is relatively narrow), a threshold voltage value Vtha where the protrusion amount d1 is da is higher than a threshold voltage value Vthb where the protrusion amount d1 is db (Vtha>Vthb).

As shown in FIG. 2, both when the protrusion amount d1 is da and when the protrusion amount d1 is db, the threshold voltage value where the gate width W is Wb is higher than the threshold voltage value where the gate width W is Wa. In other words, the threshold voltage increases with a decrease in the gate width.

Moreover, as shown in FIG. 2, the rate of the increase in the threshold voltage where the protrusion amount d1 is da (see the thick line) is higher than the rate of the increase in the threshold voltage where the protrusion amount d1 is db (see the thin line). In other words, the rate of the increase in the threshold voltage increases with an increase in the protrusion amount. This shows that the protrusion amount is intimately involved with the increase in the threshold voltage.

The reason why the threshold voltage increases with a decrease in the gate width may be as follows.

During a thermal treatment after formation of the high-k film containing La, if oxygen (O) is supplied to the high-k film (particularly, a portion of the high-k film which contacts the active region), so that the O reacts with the La contained in the high-k film, dipoles are neutralized. As a result, the flat-band voltage is shifted toward the positive region, and the effective work function of the n-type MIS transistor is shifted toward the mid-gap, and therefore, the threshold voltage of the n-type MIS transistor increases. Here, a main supply source of the O which reacts with the La contained in the high-k film may be the separation region etc. Also, here, the thermal treatment may be, for example, one which is performed to activate an n-type impurity contained in an n-type source/drain injection region.

When the protrusion amount d1 is constant, the ratio of the protrusion amount d1 to the gate width W increases with a decrease in the gate width W. An amount of the high-k film which contacts the separation region increases with an increase in the ratio of the protrusion amount d1 to the gate width W. Therefore, during the thermal treatment, a larger amount of oxygen (O) is supplied from the separation region to the high-k film, so that the dipole neutralization is more significant, and therefore, the threshold voltage of the n-type MIS transistor becomes significantly higher.

As can be seen from the above description, the present inventors have further intensively studied the above novel problem which was found by themselves, to find that it is effective to reduce the protrusion amount in order to reduce or prevent the increase in the threshold voltage. The present disclosure has been made based on the finding of the present inventors.

Figure 4A:
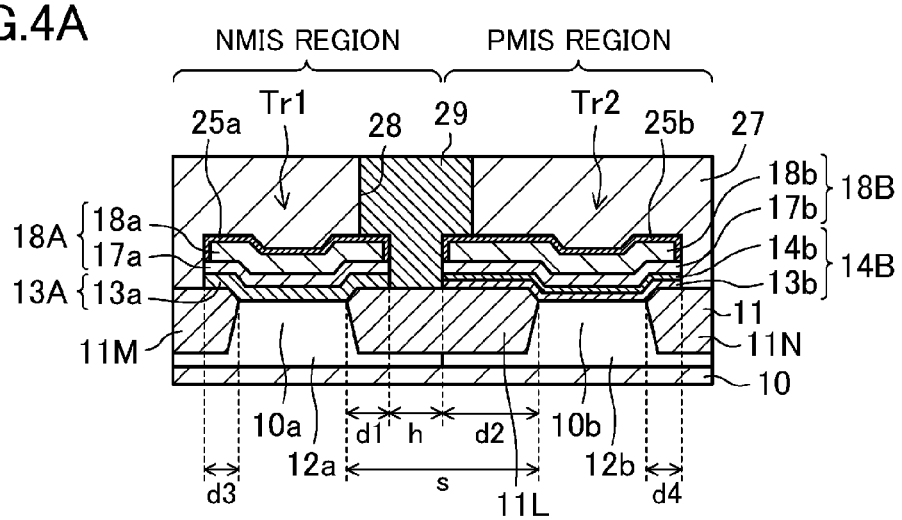
FIGS. 4A-4D are cross-sectional views showing the configuration of the semiconductor device of the first embodiment of the present disclosure.
Figure 32A:
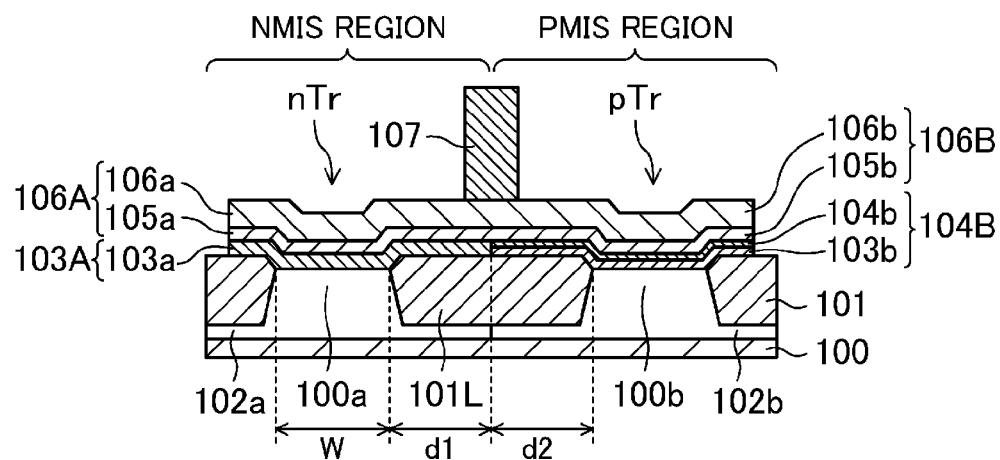
FIGS. 32A and 32B are cross-sectional views showing the configuration of the conventional semiconductor device.
Figure 32B:
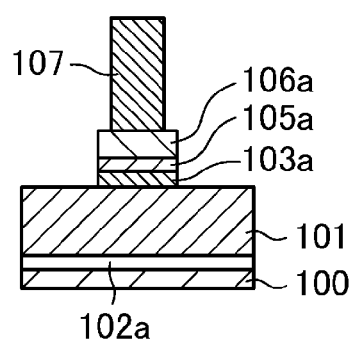
Figure 33:
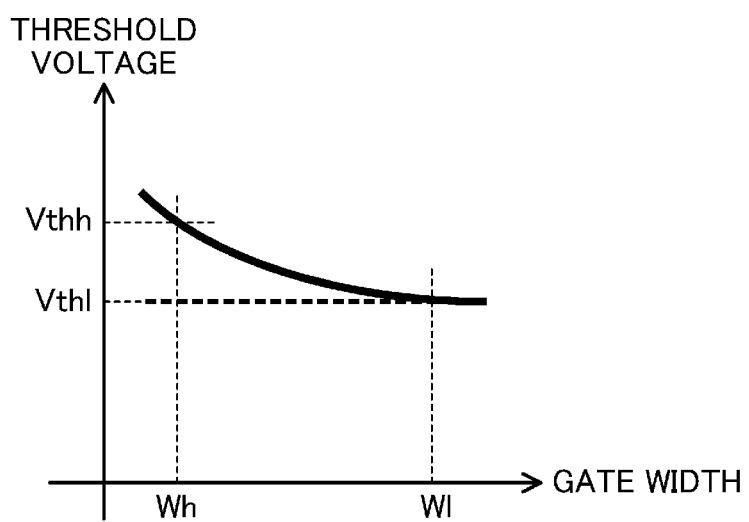
FIG. 33 is a graph showing a relationship between the gate width and the threshold voltage.

Specifically, in the present disclosure, as described below, as shown in FIG. 4A, a distance s (a largest width of a first separation region 11L) between a first end of the first active region and a first end of the second active region and a protrusion amount d1 from the first end of the first active region to a first end of the first gate insulating film establish a relationship d1<0.5s. In contrast to this, conventionally, as described above, as shown in FIG. 32A, the relationship d1=d2 is established. In other words, a relationship d1=0.5s is established, where s is a distance between the first end of the first active region 100a and the first end of the second active region 100b. Because the relationship d1<0.5s is established, the protrusion amount can be reduced compared to the conventional art.

Embodiments of the present disclosure will be described hereinafter with reference to the drawings.

(First Embodiment)

Figure 3:
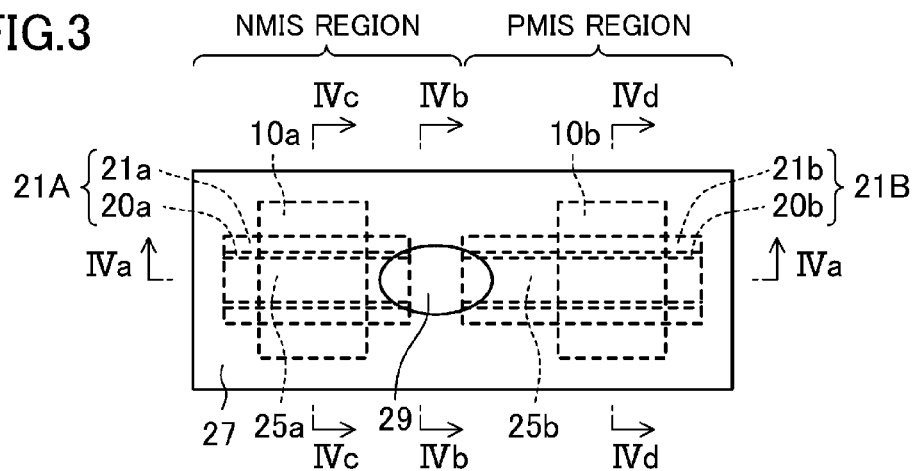
FIG. 3 is a plan view showing a configuration of a semiconductor device according to a first embodiment of the present disclosure.
Figure 4B:
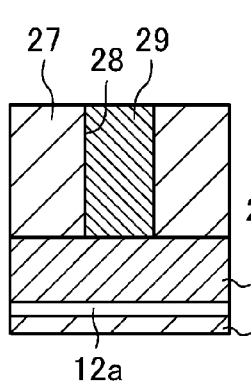
Figure 4C:
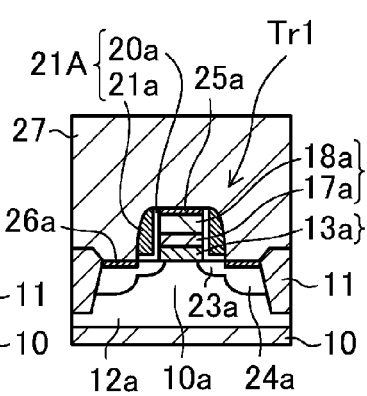
Figure 4D:
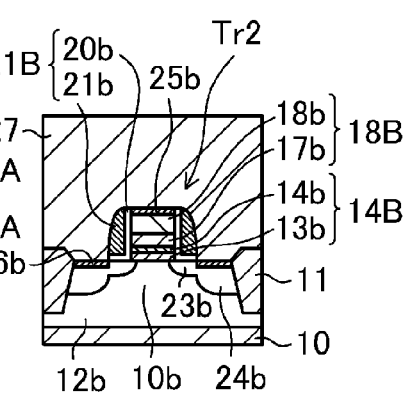

A configuration of a semiconductor device according to a first embodiment of the present disclosure with reference to FIGS. 3 and 4A-4D. FIG. 3 is a plan view showing the configuration of the semiconductor device of the first embodiment of the present disclosure. FIG. 4A is a cross-sectional view taken along the gate width direction showing the configuration of the semiconductor device of the first embodiment of the present disclosure. FIGS. 4B-4D are cross-sectional views taken along the gate length direction showing the configuration of the semiconductor device of the first embodiment of the present disclosure. Specifically, FIG. 4A-4D are cross-sectional views taken along line IVa-IVa, line IVb-IVb, line IVc-IVc, and line IVd-IVd, respectively, of FIG. 3. In FIGS. 3 and 4A, an NMIS region is shown on the left side and a PMIS region is shown on the right side. The "NMIS region" is a region where an n-type first MIS transistor is formed. The "PMIS region" is a region where a p-type second MIS transistor is formed.

The semiconductor device of this embodiment includes a first MIS transistor Tr1 which is formed on a first active region 10a surrounded by a separation region 11 of a semiconductor substrate 10, and a second MIS transistor Tr2 which is formed on a second active region 10b surrounded by the separation region 11 of the semiconductor substrate 10. A p-type well region 12a is formed in the NMIS region of the semiconductor substrate 10. On the other hand, an n-type well region 12b is formed in the PMIS region of the semiconductor substrate 10.

As shown in FIGS. 4A and 4C, the first MIS transistor Tr1 includes a first gate insulating film 13A formed on the first active region 10a of the semiconductor substrate 10, a first gate electrode 18A formed on the first gate insulating film 13A, n-type extension regions 23a formed in the first active region 10a adjacent to the channel region below the first gate electrode 18A and extending laterally away from it (also referred to as "in the first active region 10a laterally outside the first gate electrode 18A"), first sidewalls 21A formed on side surfaces in the gate length direction of the first gate electrode 18A, n-type source/drain regions 24a formed in the first active region 10a adjacent to the n-type extension regions 23a below the first sidewalls 21A and extending laterally away from them (also referred to as "in the first active region 10a laterally outside the first sidewalls 21A"), a first silicide film 25a on a top surface, and side surfaces in the gate width direction, of the first gate electrode 18A, and a third silicide film 26a formed on the n-type source/drain regions 24a.

As shown in FIGS. 4A and 4D, the second MIS transistor Tr2 includes a second gate insulating film 14B formed on the second active region 10b of the semiconductor substrate 10, a second gate electrode 18B formed on the second gate insulating film 14B, p-type extension regions 23b formed in the second active region 10b adjacent to the channel region below the second gate electrode 18B and extending laterally away from it (also referred to as "in the second active region 10b laterally outside the second gate electrode 18B"), second sidewalls 21B formed on side surfaces in the gate length direction of the second gate electrode 18B, p-type source/drain regions 24b formed in the second active region 10b adjacent to the p-type extension regions 23b below the second sidewalls 21B and extending laterally away from them (also referred to as "in the second active region 10b laterally outside the second sidewalls 21B"), a second silicide film 25b formed on a top surface, and side surfaces in the gate width direction, of the second gate electrode 18B, and a fourth silicide film 26b formed on the p-type source/drain regions 24b.

As shown in FIGS. 4A and 4C, the first gate insulating film 13A includes a first high-k film 13a containing a first adjustment metal (e.g., La). As shown in FIGS. 4A and 4D, the second gate insulating film 14B includes a second high-k film 13b, and a second adjustment metal film 14b containing a second adjustment metal (e.g., Al). The first gate insulating film 13A contains the first adjustment metal, and the second gate insulating film 14B does not contain the first adjustment metal. On the other hand, the second gate insulating film 14B contains the second adjustment metal, and the first gate insulating film 13A does not contain the second adjustment metal. Here, an interface layer (e.g., a $SiO_2$ film etc.) may be formed between the first and second high-k films 13a and 13b of the first and second gate insulating films 13A and 14B, and the first and second active regions 10a and 10b.

As shown in FIGS. 4A and 4C, the first gate electrode 18A includes a first metal film 17a and a first silicon film 18a. As shown in FIGS. 4A and 4D, the second gate electrode 18B includes a second metal film 17b and a second silicon film 18b.

As shown in FIG. 4C, the first sidewall 21A includes a first inner sidewall 20a having an L-shaped cross-section and a first outer sidewall 21a. As shown in FIG. 4D, the second sidewall 21B includes a second inner sidewall 20b having an L-shaped cross-section and a second outer sidewall 21b.

As shown in FIG. 4A, the second active region 10b is located on the opposite side in the gate width direction of the first separation region 11L as viewed from the first active region 10a. In other words, the second active region 10b faces the first active region 10a in the gate width direction with the first separation region 11L being interposed between the first and second active regions 10a and 10b.

As shown in FIG. 4A, the separation region 11 includes the first, a second, and a third separation region 11L, 11M, and 11N. Here, the "first separation region 11L" in the separation region 11 is a region located between the first and second active regions 10a and 10b. The "second separation region 11M" in the separation region 11 is a region facing the first separation region 11L with the first active region 10a being interposed between the first separation region 11L and that region. The "third separation region 11N" in the separation region 11 is a region facing the first separation region 11L with the second active region 10b being interposed between the first separation region 11L and that region.

As shown in FIG. 4A, an interlayer insulating film 27 is formed on the semiconductor substrate 10 to cover the first and second MIS transistors Tr1 and Tr2. A contact plug 29 is formed in a contact hole 28 provided in the interlayer insulating film 27.

As shown in FIG. 4A, the first and second gate insulating films 13A and 14B are separated from each other on the first separation region 11L. The first and second gate electrodes 18A and 18B are separated from each other on the first separation region 11L. The contact plug 29 is formed on the first separation region 11L, covering end portions of the first and second gate electrodes 18A and 18B. The contact plug 29 contacts end portions of the first and second silicide films 25a and 25b. The first and second gate electrodes 18A and 18B are electrically connected together via the contact plug 29.

As shown in FIG. 4B, the contact plug 29 is formed on the separation region 11.

As shown in FIG. 3, the separation region (see 11 in FIG. 4A-4D) is formed in an upper portion of the semiconductor substrate 10, surrounding the first and second active regions 10a and 10b. The separation region separates the first and second active regions 10a and 10b from each other.

As shown in FIG. 3, the first gate electrode (see 18A in FIGS. 4A and 4C) is formed on the first active region 10a with the first gate insulating film (see 13A in FIGS. 4A and 4C) being interposed therebetween. The first sidewalls 21A are formed on the side surfaces in the gate length direction of the first gate electrode. The first silicide film 25a is formed on the top surface, and the side surfaces in the gate width direction, of the first gate electrode. The third silicide film (not shown in FIG. 3, see 26a in FIG. 4C) is formed on the n-type source/drain regions (not shown in FIG. 3, see 24a in FIG. 4C) formed in the first active region 10a laterally outside the first sidewalls 21A.

As shown in FIG. 3, the second gate electrode (see 18B in FIGS. 4A and 4D) is formed on the second active region 10b with the second gate insulating film (see 14B in FIGS. 4A and 4D) being interposed therebetween. The second sidewalls 21B are formed on the side surfaces in the gate length direction of the second gate electrode. The second silicide film 25b is formed on the top surface, and the side surfaces in the gate width direction, of the second gate electrode. The fourth silicide film (not shown in FIG. 3, see 26b in FIG. 4D) is formed on the p-type source/drain regions (not shown in FIG. 3, see 24b in FIG. 4D) formed in the second active region 10b laterally outside the second sidewalls 21B.

As shown in FIG. 3, the interlayer insulating film 27 is formed on the semiconductor substrate 10 to cover the first and second MIS transistors Tr1 and Tr2. The contact plug 29 is formed in the contact hole provided in the interlayer insulating film 27.

As shown in FIG. 3, the first sidewalls 21A are formed on the side surfaces in the gate length direction of the first gate electrode 18A, but not on the side surfaces in the gate width direction of the first gate electrode 18A. As shown in FIG. 3, the second sidewalls 21B are formed on the side surfaces in the gate length direction of the second gate electrode 18B, but not on the side surfaces in the gate width direction of the second gate electrode 18B.

A distance s between a first end of the first active region 10a and a first end of the second active region 10b and a protrusion amount d1 from the first end of the first active region 10a to a first end of the first gate insulating film 13A establish the following relationship:

$$d1 < 0.5s$$

The distance s, the protrusion amount d1, and a distance h between the first end of the first gate insulating film 13A and a first end of the second gate insulating film 14B establish the following relationship:

$$d1 \leq 0.5(s-h)$$

The protrusion amount d1 and a protrusion amount d2 from the first end of the second active region 10b to the first end of the second gate insulating film 14B establish the following relationship:

$$d1 < d2$$

The protrusion amount d1 and a protrusion amount d3 from a second end of the first active region 10a to a second end of the first gate insulating film 13A establish the following relationship:

$$d3 \leq d1$$

The protrusion amount d2 and a protrusion amount d4 from a second end of the second active region 10b to a second end of the second gate insulating film 14B establish the following relationship:

$$d4 \leq d2$$

Here, as shown in FIG. 4A, the "first ends" of the first and second active regions 10a and 10b are ends contacting the first separation region 11L of surfaces of the first and second active regions 10a and 10b. The "second ends" of the first and second active regions 10a and 10b are ends contacting the second and third separation regions 11M and 11N of the surfaces of first and second active regions 10a and 10b. The first ends of the first and second active regions 10a and 10b face or are adjacent to each other with the first separation region 11L being interposed therebetween. Here, as shown in FIG. 4A, the "first ends" of the first and second gate insulating films 13A and 14B are ends located on the first separation region 11L. The "second ends" of the first and second gate insulating films 13A and 14B are ends located on the second and third separation regions 11M and 11N.

A method for fabricating the semiconductor device of the first embodiment of the present disclosure will be described hereinafter with reference to FIGS. 5, 6A-6D, 7, 8A-8D, 9, 10A-10D, 11, 12A-12D, 13, 14A-14D, 15, 16A-16D, 17, and 18A-18D. FIGS. 5, 7, 9, 11, 13, 15, and 17 are plan views of the semiconductor device of the first embodiment of the present disclosure in the order in which the semiconductor device is fabricated. FIGS. 6A, 8A, 10A, 12A, 14A, 16A, and 18A are cross-sectional views taken along the gate width direction showing the semiconductor device of the first embodiment of the present disclosure in the order in which the semiconductor device is fabricated. FIGS. 6B-6D, 8B-8D, 10B-10D, 12B-12D, 14B-14D, 16B-16D, and 18B-18D are cross-sectional views taken along the gate length direction showing the semiconductor device of the first embodiment of the present disclosure in the order in which the semiconductor device is fabricated. Specifically, FIGS. 6A, 8A, 10A, 12A, 14A, 16A, and 18A are cross-sectional views taken along line VIa-VIa of FIG. 5, line VIIIa-VIIIa of FIG. 7, line Xa-Xa of FIG. 9, line XIIa-XIIa of FIG. 11, line XIVa-XIVa of FIG. 13, line XVIa-XVIa of FIG. 15, and line XVIIIa-XVIIIa of FIG. 17, respectively. FIGS. 6B, 8B, 10B, 12B, 14B, 16B, and 18B are cross-sectional views taken along line VIb-VIb of FIG. 5, line VIIIb-VIIIb of FIG. 7, line Xb-Xb of FIG. 9, line XIIb-XIIb of FIG. 11, line XIVb-XIVb of FIG. 13, line XVIb-XVIb of FIG. 15, and line XVIIIb-XVIIIb of FIG. 17, respectively. FIGS. 6C, 8C, 10C, 12C, 14C, 16C, and 18C are cross-sectional views taken along line VIc-VIc of FIG. 5, line VIIIc-VIIIc of FIG. 7, line Xc-Xc of FIG. 9, line XIIc-XIIc of FIG. 11, line XIVc-XIVc of FIG. 13, line XVIc-XVIc of FIG. 15, and line XVIIIc-XVIIIc of FIG. 17, respectively. FIGS. 6D, 8D, 10D, 12D, 14D, 16D, and 18D are cross-sectional views taken along line VId-VId of FIG. 5, line VIIId-VIIId of FIG. 7, line Xd-Xd of FIG. 9, line XIId-XIId of FIG. 11, line XIVd-XIVd of FIG. 13, line XVId-XVId of FIG. 15, and line XVIIId-XVIIId of FIG. 17. In FIGS. 5-17 and 6A-18A, FIGS. 19-25 and 20A-26A of a second embodiment described below, and FIGS. 27-29 and 28A-30A of a variation of the second embodiment, the NMIS region is shown on the left side and the PMIS region is shown on the right side.

Initially, as shown in FIGS. 5 and 6A-6D, the separation region 11 is selectively formed in the upper portion of the semiconductor substrate 10 made of, for example, silicon by, for example, shallow trench isolation (STI). As a result, the first active region 10a surrounded by the separation region 11 is formed in the semiconductor substrate 10 in the NMIS region. In addition, the second active region 10b surrounded by the separation region 11 is formed in the semiconductor substrate 10 in the PMIS region. The gate width W is, for example, about 200 nm. Thereafter, the p-type well region 12a is formed in the semiconductor substrate 10 in the NMIS region. On the other hand, the n-type well region 12b is formed in the semiconductor substrate 10 in the PMIS region.

Next, as shown in FIGS. 5 and 6A-6D, a high-k film 13 is formed on the semiconductor substrate 10. Examples of a material for the high-k film 13 include HfSiO, HfSiON, HfO, HfON, HfZrO, HfZrON, etc.

Thereafter, a second adjustment metal film 14 containing the second adjustment metal (e.g., Al) is formed on a portion of the high-k film 13 which is formed in the PMIS region (this portion includes a second portion of the high-k film 13 which is located on the second active region 10b).

Thereafter, a passivation film 15 made of, for example, titanium nitride (TiN) is formed on the second adjustment metal film 14. Thereafter, a first adjustment metal film 16 containing the first adjustment metal (e.g., La) is formed on a portion of the high-k film 13 which is formed in the NMIS region (this portion includes a first portion of the high-k film 13 which is located on the first active region 10a) and on the passivation film 15. Thereafter, the first adjustment metal contained in the first adjustment metal film 16 is introduced by a thermal treatment into the portion of the high-k film 13 which is formed in the NMIS region. As a result, dipoles are generated in the portion of the high-k film 13 which is formed in the NMIS region. Thereafter, a portion (in other words, an unreacted portion) of the first adjustment metal film 16 which is left on the passivation film 15 etc., and the passivation film 15, are removed by, for example, wet etching. Note that the passivation film 15 may be made of tantalum nitride (TaN), silicon (Si), or silicon nitride (SiN).

Thus, as shown in FIGS. 7 and 8A-8D described below, a first gate insulating film formation film 13X including a first high-k film 13x containing the first adjustment metal is formed on the semiconductor substrate 10 in the NMIS region. On the other hand, a second gate insulating film formation film 14Y including a second high-k film 13y and the second adjustment metal film 14 is formed on the semiconductor substrate 10 in the PMIS region.

Next, as shown in FIGS. 7 and 8A-8D, a metal film 17 made of, for example, TiN or tantalum nitride (TaN) is formed on the first and second gate insulating film formation films 13X and 14Y by, for example, chemical vapor deposition (CVD). Thereafter, a silicon film 18 made of, for example, polysilicon is formed on the metal film 17 by, for example, CVD. Thus, a gate electrode formation film 18Z including the metal film 17 and the silicon film 18 is formed on the first and second gate insulating film formation films 13X and 14Y.

Figure 8A:
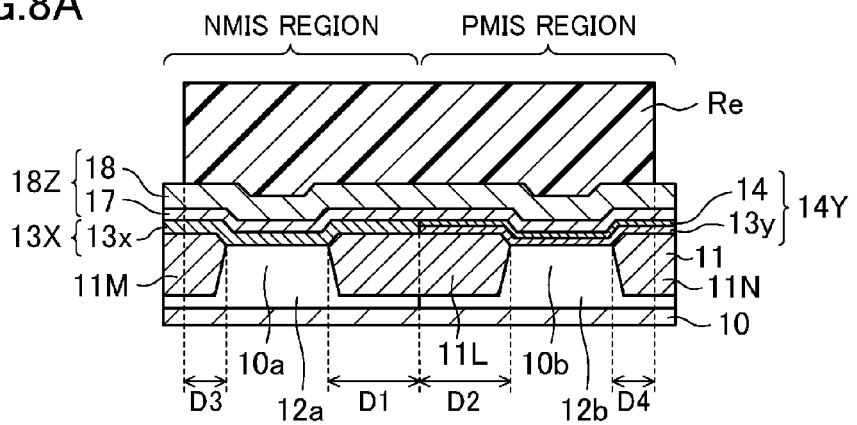
FIGS. 8A-8D are cross-sectional views showing the method for fabricating the semiconductor device of the first embodiment of the present disclosure.
Figure 8B:
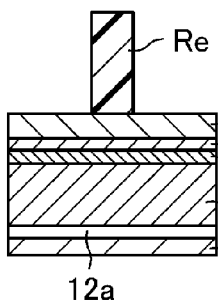
Figure 8C:
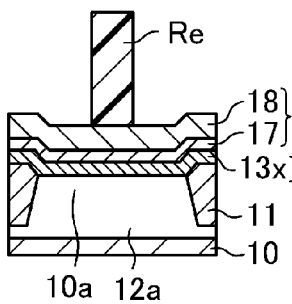
Figure 8D:
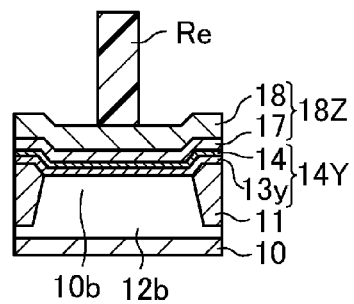
Figure 11:
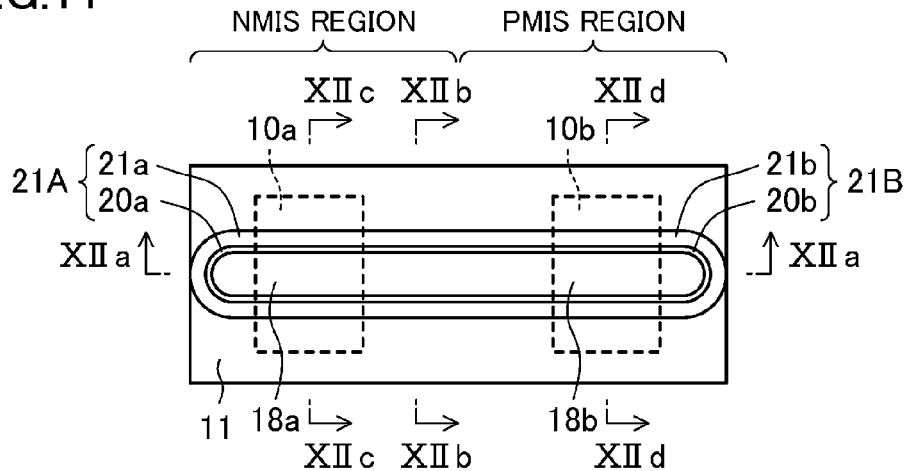
FIG. 11 is a plan view showing the method for fabricating the semiconductor device of the first embodiment of the present disclosure.
Figure 12A:
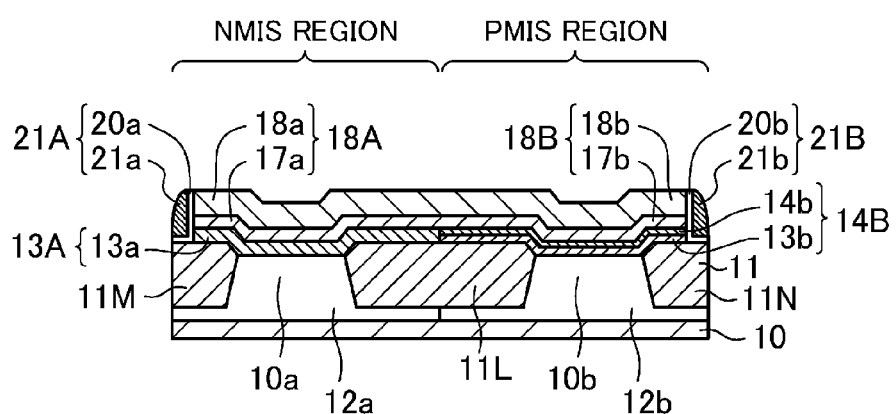
FIGS. 12A-12D are cross-sectional views showing the method for fabricating the semiconductor device of the first embodiment of the present disclosure.
Figure 12B:
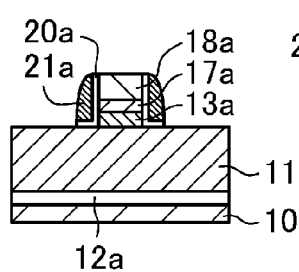
Figure 12C:
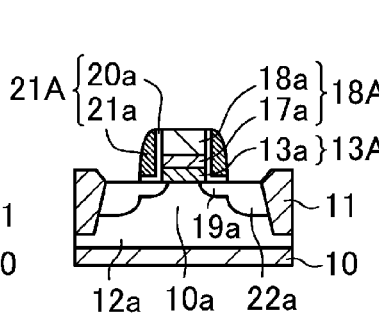
Figure 12D:
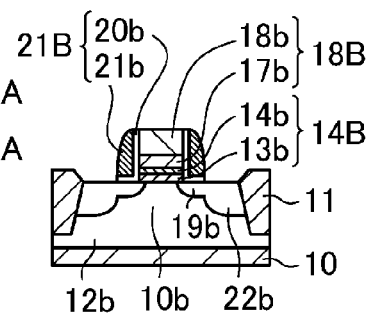
Figure 13:
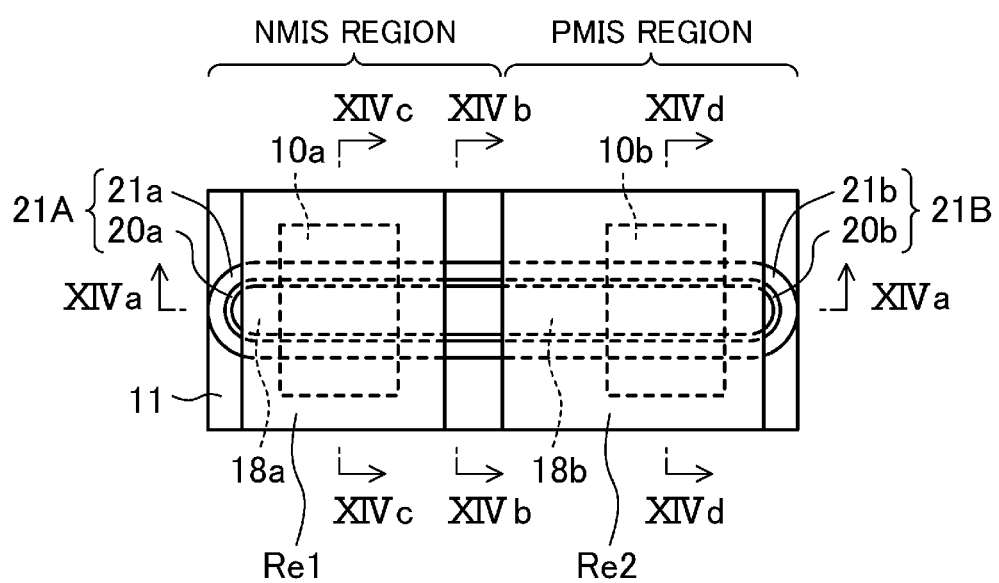
FIG. 13 is a plan view showing the method for fabricating the semiconductor device of the first embodiment of the present disclosure.

In this case, as shown in FIG. 8A, a distance D1 from the first end of the first active region 10a to a first end of the first gate insulating film formation film 13X and a distance D2 from the first end of the second active region 10b to a first end of the second gate insulating film formation film 14Y are designed to be equal to each other (i.e., D1=D2). The distances D1 and D2 are, for example, about 100 nm. Here, as shown in FIG. 8A, the "first ends" of the first and second gate insulating film formation films 13X and 14Y are ends located on the first separation region 11L.

Thus, even if the first and second gate insulating film formation films 13X and 14Y are not accurately positioned relative to the first and second active regions 10a and 10b, the first gate insulating film formation film 13X can be effectively prevented from extending beyond the separation region 11 onto the second active region 10b, or conversely, the second gate insulating film formation film 14Y can be effectively prevented from extending beyond the separation region 11 onto the first active region 10a.

Next, as shown in FIGS. 7 and 8A-8D, a resist pattern Re is formed on the gate electrode formation film 18Z by photolithography.

In this case, as shown in FIG. 8A, the resist pattern Re is formed so that a first end thereof protrudes from the second end of the first active region 10a, extending above the second separation region 11M by a distance D3. Similarly, a second end of the resist pattern Re protrudes from the second end of the second active region 10b, extending above the third separation region 11N by a distance D4. The reason is as follows.

Figure 7:
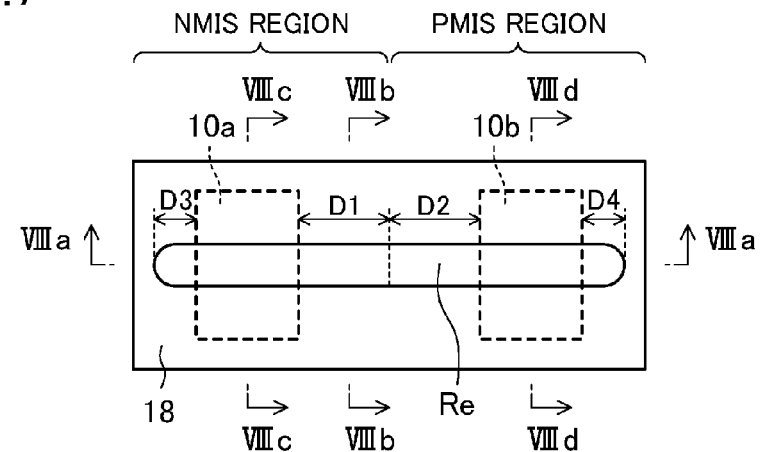
FIG. 7 is a plan view showing the method for fabricating the semiconductor device of the first embodiment of the present disclosure.

As shown in FIG. 7, end portions of the resist pattern Re have a round shape, but not a rectangular shape, as viewed from above, due to the resolution of photolithography. Therefore, as shown in FIG. 9 described below, end portions of the first and second gate electrodes 18A and 18B which are formed by patterning using the resist pattern Re as a mask have a round shape as viewed from above, similar to the resist pattern Re. Therefore, the resist pattern Re is formed so that the first and second ends thereof protrude the second ends of the first and second active regions 10a and 10b, extending above the second and third separation regions 11M and 11N by the distances D3 and D4. The distances D3 and D4 are, for example, about 100 nm.

As a result, as shown in FIG. 9 described below, the end portions of the first and second gate electrodes 18A and 18B (in other words, the round portions as viewed from above) can be prevented from straddling borders between the first and second active regions 10a and 10b and the second and third separation regions 11M and 11N. As a result, the gate lengths at the end portions of the first and second active regions 10a and 10b can be prevented from being shorter than the gate lengths at portions (e.g., a middle portion) other than the end portions of the first and second active regions 10a and 10b. In other words, the gate lengths between the first and second ends of the first and second active regions 10a and 10b can be constant.

Next, as shown in FIGS. 9 and 10A-10D, the gate electrode formation film 18Z including the metal film 17 and the silicon film 18, the first gate insulating film formation film 13X including the first high-k film 13x containing the first adjustment metal, and the second gate insulating film formation film 14Y including the second high-k film 13y and the second adjustment metal film 14, are successively patterned by, for example, dry etching using the resist pattern Re as a mask. As a result, the first gate insulating film 13A including the first high-k film 13a containing the first adjustment metal, and the first gate electrode 18A including the first metal film 17a and the first silicon film 18a, are successively formed on the first active region 10a. In addition, the second gate insulating film 14B including the second high-k film 13b and the second adjustment metal film 14b, and the second gate electrode 18B including the second metal film 17b and the second silicon film 18b, are successively formed on the second active region 10b. Thereafter, the resist pattern Re is removed.

Next, as shown in FIGS. 9 and 10A-10D, n-type extension injection regions 19a are formed in the first active region 10a laterally outside the first gate electrode 18A. On the other hand, p-type extension injection regions 19b are formed in the second active region 10b laterally outside the second gate electrode 18B.

Next, as shown in FIGS. 11 and 12A-12D, an inner sidewall formation film formed of, for example, a silicon oxide film ($SiO_2$ film) and an outer sidewall formation film formed of, for example, a silicon nitride film (SiN film) are successively formed on an entire surface of the semiconductor substrate 10 by, for example, CVD. Thereafter, for example, anisotropic dry etching is successively performed on the outer and inner sidewall formation films. As a result, the first and second sidewalls 21A and 21B including the first and second inner sidewalls 20a and 20b with an L-shaped cross-section and the first and second outer sidewalls 21a and 21b are formed on the side surfaces of the first and second gate electrodes 18A and 18B.

Next, as shown in FIGS. 11 and 12A-12D, n-type source/drain injection regions 22a are formed in the first active region 10a laterally outside the first sidewalls 21A. On the other hand, p-type source/drain injection regions 22b are formed in the second active region 10b laterally outside the second sidewalls 21B. Note that the n-type and p-type source/drain injection regions 22a and 22b may be formed after the steps of FIGS. 15 and 16A-16D, i.e., after a space is formed between the first and second gate electrodes 18A and 18B by etching.

Next, as shown in FIGS. 13 and 14A-14D, a first and a second resist pattern Re1 and Re2 are formed on the first and second gate electrodes 18A and 18B by photolithography.

Figure 14A:
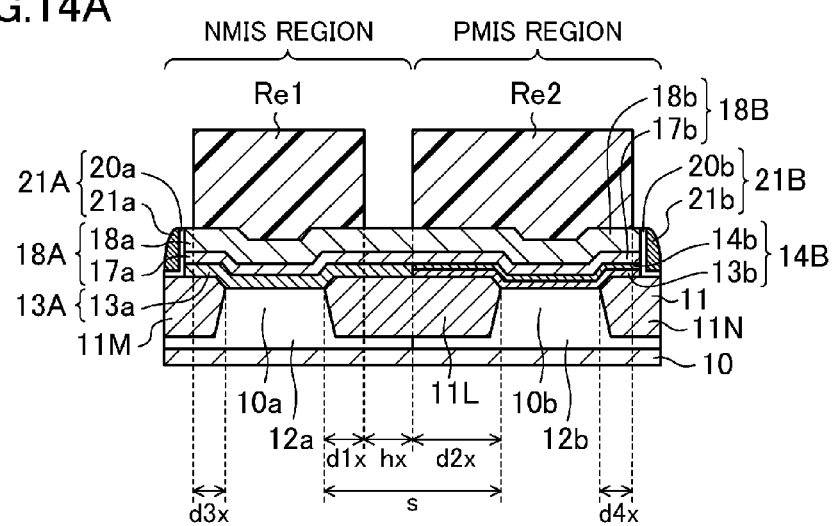
FIGS. 14A-14D are cross-sectional views showing the method for fabricating the semiconductor device of the first embodiment of the present disclosure.
Figures 14B, 14C, 14D:
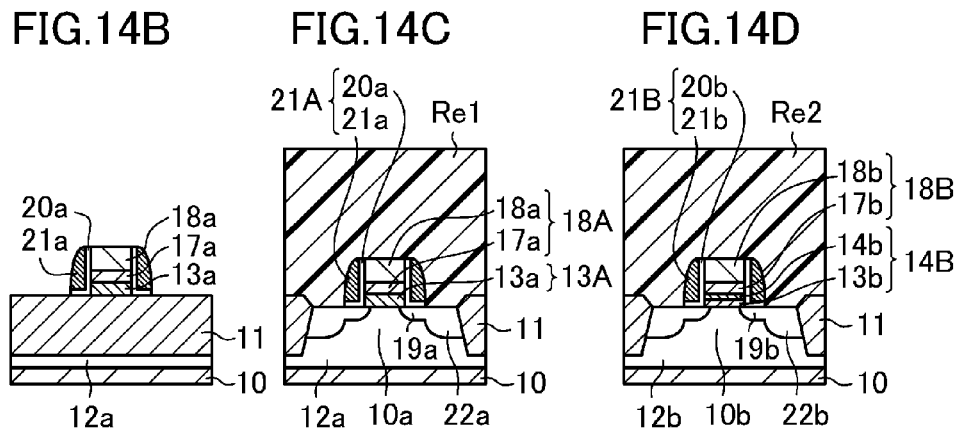
Figure 15:
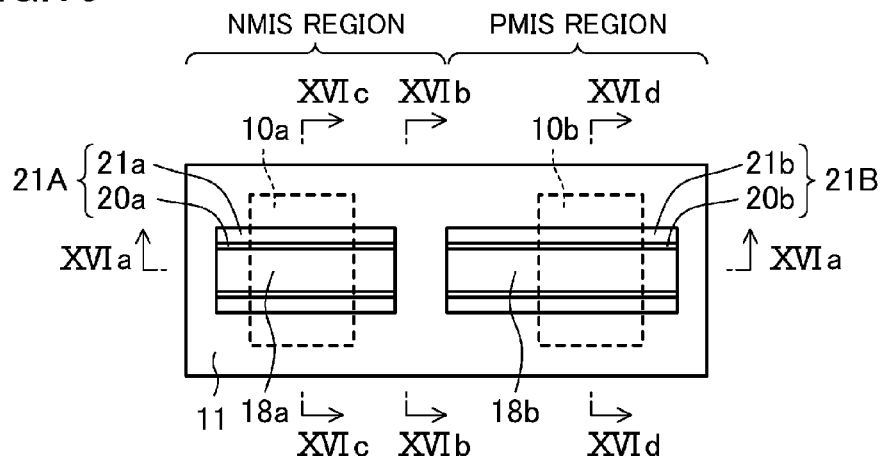
FIG. 15 is a plan view showing the method for fabricating the semiconductor device of the first embodiment of the present disclosure.

In this case, as shown in FIG. 14A, the distance s between the first ends of the first and second active regions 10a and 10b and a protrusion amount d1x from the first end of the first active region 10a to a first end of the first resist pattern Re1 are designed to establish a relationship $d1x<0.5s$.

The distance s, the protrusion amount d1x, and a distance hx between the first end of the first resist pattern Re1 and a first end of the second resist pattern Re2 are designed to establish a relationship $d1x<0.5(s-hx)$.

The protrusion amount d1x and a protrusion amount d2x from the first end of the second active region 10b to the first end of the second resist pattern Re2 are designed to establish a relationship $d1x<d2x$.

The protrusion amount d1x and a protrusion amount d3x from the second end of the first active region 10a to a second end of the first resist pattern Re1 are designed to establish a relationship $d3x \leq d1x$.

The protrusion amount d2x and a protrusion amount d4x from the second end of the second active region 10b to a second end of the second resist pattern Re2 are designed to establish a relationship $d4x \leq d2x$.

The distance s is, for example, about 200 nm. The distance hx is, for example, about 60 nm. The protrusion amount d1x is, for example, about 40 nm. The protrusion amount d2x is, for example, about 100 nm. The protrusion amount d3x is, for example, about 30 nm. The protrusion amount d4x is, for example, about 30 nm.

Next, as shown in FIGS. 15 and 16A-16D, the first and second gate electrodes 18A and 18B, the first and second gate insulating films 13A and 14B, and the first and second sidewalls 21A and 21B are patterned by, for example, etching using the first and second resist patterns Re1 and Re2 as a mask.

Figure 16A:
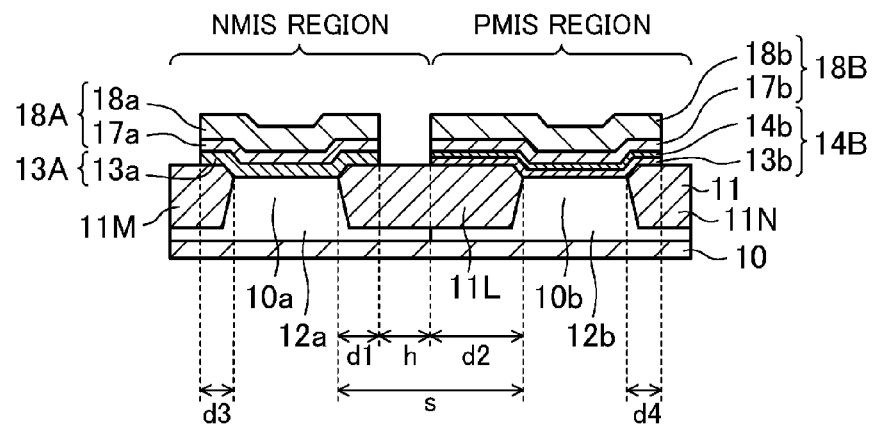
FIGS. 16A-16D are cross-sectional views showing the method for fabricating the semiconductor device of the first embodiment of the present disclosure.
Figure 16B:
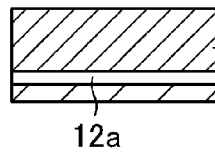
Figure 16C:
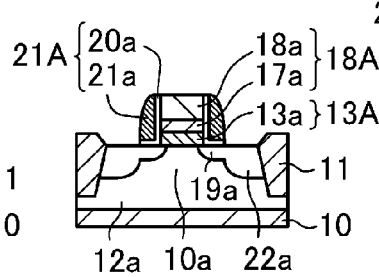
Figure 16D:
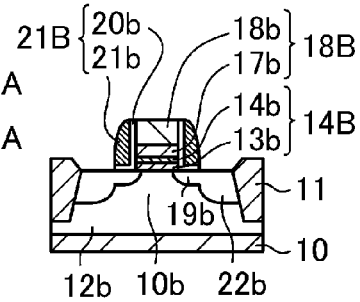

The first sidewalls 21A, the first gate electrode 18A, and the first gate insulating film 13A are removed from the first separation region 11L by etching. As a result, as shown in FIG. 16A, the protrusion amount from the first end of the first active region 10a to the first end of the first gate insulating film 13A is reduced, whereby the first and second gate insulating films 13A and 14B are separated from each other on the first separation region 11L.

In addition, the first sidewalls 21A, the first gate electrode 18A, and the first gate insulating film 13A are removed from the second separation region 11M by etching. As a result, the protrusion amount from the second end of the first active region 10a to the second end of the first gate insulating film 13A is reduced.

In addition, the second sidewalls 21B, the second gate electrode 18B, and the second gate insulating film 14B are removed from the third separation region 11N by etching. As a result, the protrusion amount from the second end of the second active region 10b to the second end of the second gate insulating film 14B is reduced.

In this case, the first and second gate electrodes 18A and 18B are separated from each other on the first separation region 11L. In addition, the first and second sidewalls 21A and 21B are separated from each other on the first separation region 11L. In addition, the side surfaces in the gate width direction of the first and second gate electrodes 18A and 18B are exposed.

Thereafter, the first and second resist patterns Re1 and Re2 are removed. The first and second gate electrodes 18A and 18B have a rectangular shape as viewed from above.

In this case, as shown in FIG. 16A, the distance s between the first ends of the first and second active regions 10a and 10b, and the protrusion amount d1 from the first end of the first active region 10a to the first end of the first gate insulating film 13A, establish the following relationship:

$$d1<0.5s$$

The distance s, the protrusion amount d1, and the distance h between the first end of the first gate insulating film 13A and the first end of the second gate insulating film 14B establish the following relationship:

$$d1 \leq 0.5(s-h)$$

The protrusion amount d1 and the protrusion amount d2 from the first end of the second active region 10b to the first end of the second gate insulating film 14B establish the following relationship:

$$d1<d2$$

The protrusion amount d1 and the protrusion amount d3 from the second end of the first active region 10a to the second end of the first gate insulating film 13A establish the following relationship:

$$d3 \leq d1$$

The protrusion amount d2 and the protrusion amount d4 from the second end of the second active region 10b to the second end of the second gate insulating film 14B establish the following relationship:

$$d4 \leq d2$$

Next, as shown in FIGS. 17 and 18A-18D, a thermal treatment is performed at, for example, 900° C. As a result, n-type and p-type impurities contained in the n-type and p-type extension injection regions 19a and 19b are activated to form the n-type and p-type extension regions 23a and 23b. In addition, n-type and p-type impurities contained in the n-type and p-type source/drain injection regions 22a and 22b are activated to form the n-type and p-type source/drain regions 24a and 24b.

In this case, the second adjustment metal contained in the second adjustment metal film 14b may be diffused into the second high-k film 13b, and therefore, the second high-k film 13b may contain the second adjustment metal.

In this embodiment, the relationship d1<0.5s is established. Therefore, the amount of the first gate insulating film 13A which contacts the first separation region 11L can be reduced. Moreover, the relationship d3≤d1 is established. Therefore, the amount of the first gate insulating film 13A which contacts the second separation region 11M can be reduced. Therefore, in the thermal treatment, the amount of oxygen (O) supplied from the separation region 11 to the first high-k film 13a (particularly, a portion of the first high-k film 13a which contacts the first active region 10a) can be reduced, whereby neutralization of dipoles caused by reaction of the oxygen (O) with the first adjustment metal (e.g., La) contained in the first high-k film 13a can be reduced.

Next, as shown in FIGS. 17 and 18A-18D, the first and second silicide films 25a and 25b are formed on the top surfaces, and the side surfaces in the gate width direction, of the first and second silicon films 18a and 18b. In addition, the third and fourth silicide films 26a and 26b are formed on the n-type and p-type source/drain regions 24a and 24b.

Thereafter, the interlayer insulating film 27 is formed on an entire surface of the semiconductor substrate 1. Thereafter, in the interlayer insulating film 27, the contact hole 28 is formed through which end portions of the first and second gate electrodes 18A and 18B and the first separation region 11L are exposed. Thereafter, a metal film made of, for example, tungsten (W) etc., is buried in the contact hole 28. As a result, the contact plug 29 is formed on the first separation region 11L, covering end portions of the first and second gate electrodes 18A and 18B. The contact plug 29 contacts end portions of the first and second silicide films 25a and 25b.

Figure 17:
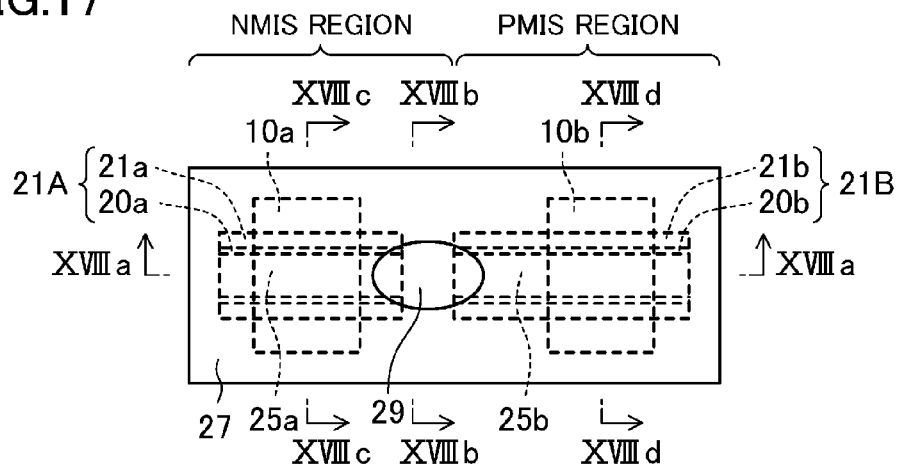
FIG. 17 is a plan view showing the method for fabricating the semiconductor device of the first embodiment of the present disclosure.
Figure 18A:
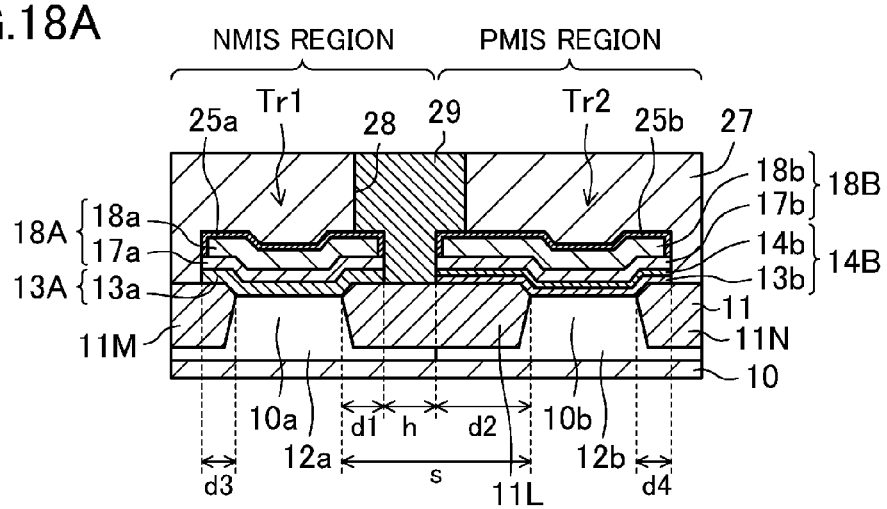
FIGS. 18A-18D are cross-sectional views showing the method for fabricating the semiconductor device of the first embodiment of the present disclosure.
Figure 18B:
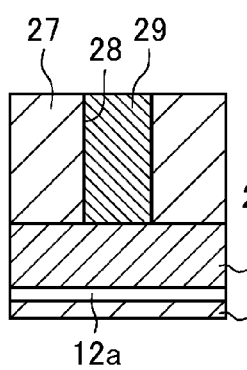
Figure 18C:
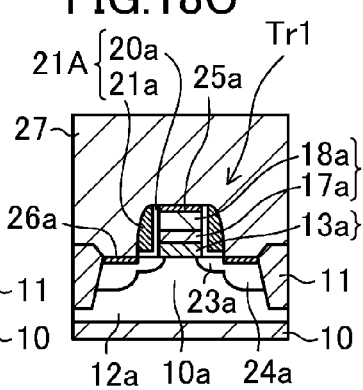
Figure 18D:
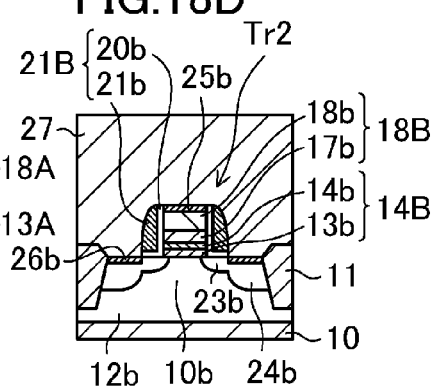
Figure 19:
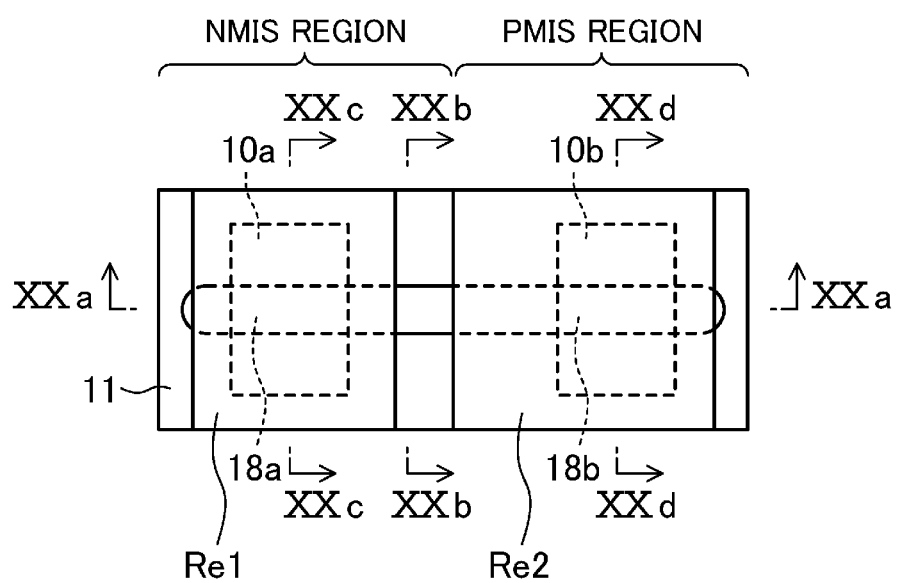
FIG. 19 is a plan view showing a method for fabricating a semiconductor device according to a second embodiment of the present disclosure.
Figure 20A:
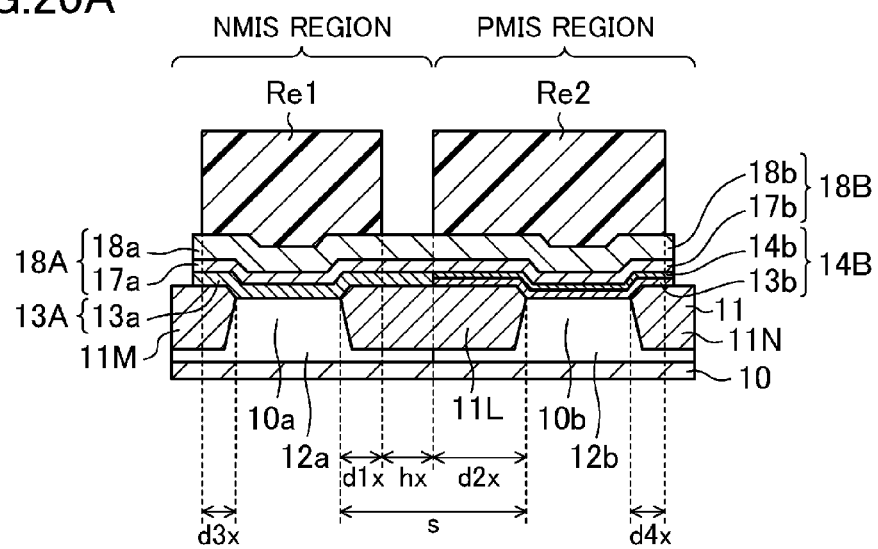
FIGS. 20A-20D are cross-sectional views showing the method for fabricating the semiconductor device of the second embodiment of the present disclosure.
Figure 20B:
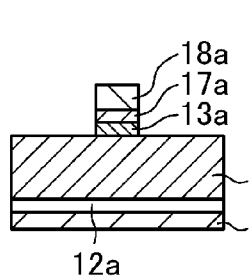
Figure 20C:
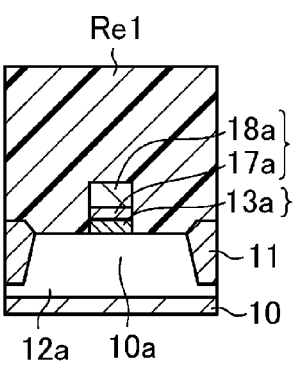
Figure 20D:
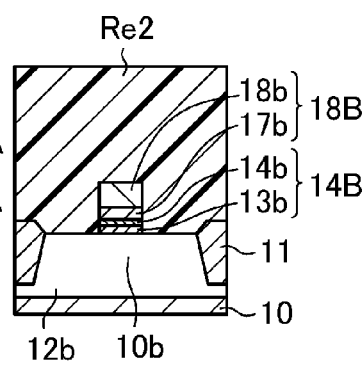
Figure 21:
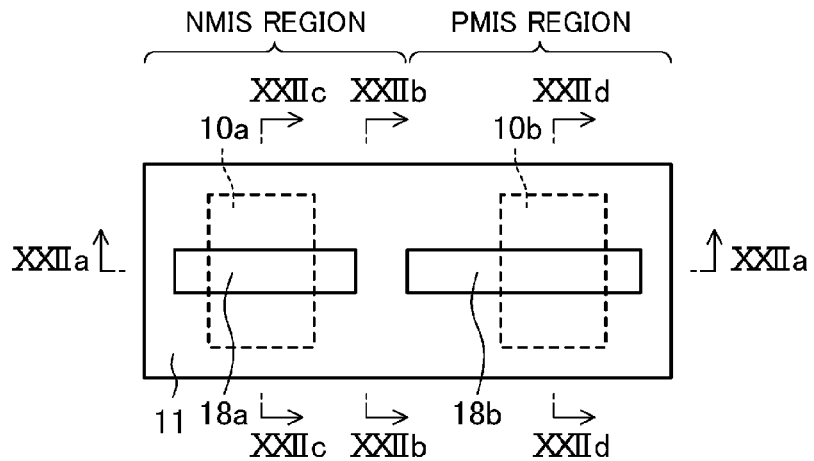
FIG. 21 is a plan view showing the method for fabricating the semiconductor device of the second embodiment of the present disclosure.

In this case, the contact plug 29 has, for example, a circular or elliptical shape as viewed from above. If the contact plug 29 has an elliptical shape as shown in FIG. 17, the area where the contact plug 29 contacts the first and second silicide films 25a and 25b can be increased.

Thus, the semiconductor device of this embodiment can be fabricated.

According to this embodiment, the relationship d1<0.5s is established. Therefore, the amount of the first gate insulating film 13A which contacts the first separation region 11L can be reduced. Therefore, for example, in the thermal treatment, the amount of oxygen (O) supplied from the separation region 11 to the first high-k film 13a (particularly, the portion of the first high-k film 13a which contacts the first active region 10a) can be reduced, whereby neutralization of dipoles caused by reaction of the oxygen (O) with the first adjustment metal (e.g., La) contained in the first high-k film 13a can be reduced. Therefore, even if the gate width W is reduced by miniaturization of a semiconductor device, the increase in the threshold voltage of the first MIS transistor Tr1 can be reduced or prevented.

In addition, the relationship d3<d1 is established. Therefore, the amount of the first gate insulating film 13A which contacts the second separation region 11M can be reduced. Therefore, for example, in the thermal treatment, the amount of oxygen (O) supplied from the separation region 11 to the first high-k film 13a can be reduced, whereby neutralization of dipoles caused by reaction of the oxygen (O) with the first adjustment metal contained in the first high-k film 13a can be reduced. Therefore, even if the gate width W is reduced by miniaturization of a semiconductor device, the increase in the threshold voltage of the first MIS transistor Tr1 can be reduced or prevented.

The first and second silicide films 25a and 25b can be formed not only on the top surfaces of the first and second silicon films 18a and 18b, but also on the side surfaces in the gate width direction of the first and second silicon films 18a and 18b. Therefore, the area where the contact plug 29 contacts the first and second silicide films 25a and 25b can be increased, resulting in a decrease in contact resistance.

In this embodiment, the relationship d1<d2 is established. Therefore, the amount of the second gate insulating film 14B which contacts the first separation region 11L is larger than the amount of the first gate insulating film 13A which contacts the first separation region 11L. However, as described above, the present inventors have found that the increase rate of the threshold voltage with a decrease in the gate width in a p-type MIS transistor is considerably smaller than that in an n-type MIS transistor. Therefore, even if the gate width is reduced by miniaturization of a semiconductor device, the threshold voltage of the second MIS transistor Tr2 does not increase.

In this embodiment, the specific example in which the relation ship d1≤0.5(s-h) is established has been described. The present disclosure is not intended to be limited to this. As shown in FIG. 4A, if the first and second gate insulating films 13A and 14B are separated from each other on the first separation region 11L, and d1 is smaller than or equal to half of (s-h), d1 can be effectively reduced. Therefore, it is preferable that the relationship d1≤0.5(s-h) be established. However, if the relationship d1<0.5s is established, the amount of the first gate insulating film 13A which contacts the first separation region 11L can be reduced compared to the conventional art. Therefore, the relationship d1≤0.5(s−h) does not necessarily need to be established. In other words, even if a relationship d1>0.5(s−h) is established, at least the relationship d1<0.5s is established, the object of the present disclosure can be achieved.

In this embodiment, the specific example in which the relationship d1<d2 is established has been described. The present disclosure is not intended to be limited to this. As shown in FIG. 4A, the first and second gate insulating films 13A and 14B are separated from each other on the first separation region 11L so that d1 is smaller than d2, whereby d1 can be effectively reduced. Therefore, it is preferable that the relationship d1<d2 be established. However, as described above, if the relationship d1<0.5s is established, the amount of the first gate insulating film 13A which contacts the first separation region 11L can be reduced compared to the conventional art. Therefore, the relationship d1<d2 does not necessarily need to be established. In other words, even if a relationship d1≥d2 is established, at least the relationship d1<0.5s is established, the object of the present disclosure can be achieved.

In this embodiment, the specific example in which the relationship d3≤d1 is established has been described. The present disclosure is not intended to be limited to this. If d3 is smaller than or equal to d1 (d1<0.5s), d3 can be effectively reduced, and the amount of the first gate insulating film 13A which contacts the second separation region 11M can be reduced. Therefore, it is preferable that the relationship d3≤d1 be established. However, as described above, if the relationship d1<0.5s is established, the amount of the first gate insulating film 13A which contacts the first separation region 11L can be reduced compared to the conventional art. The relationship d3≤d1 does not necessarily need to be established. In other words, if the relationships d1<0.5s and d3≤d1 are established, the object of the present disclosure can be effectively achieved.

(Second Embodiment)

A method for fabricating a semiconductor device according to a second embodiment of the present disclosure will be described hereinafter with reference to FIGS. 19, 20A-20D, 21, 22A-22D, 23, 24A-24D, 25, and 26A-6D. FIGS. 19, 21, 23, and 25 are plan view showing the semiconductor device of the second embodiment of the present disclosure in the order in which the semiconductor device is fabricated. FIGS. 20A, 22A, 24A, and 26A are cross-sectional views taken along the gate width direction of the semiconductor device of the second embodiment of the present disclosure in the order in which the semiconductor device is fabricated. FIGS. 20B-20D, 22B-22D, 24B-24D, and 26B-26D are cross-sectional views taken along the gate length direction of the semiconductor device of the second embodiment of the present disclosure in the order in which the semiconductor device is fabricated. Specifically, FIGS. 20A, 22A, 24A, and 26A are cross-sectional views taken along line XXa-XXa of FIG. 19, line XXIIa-XXIIa of FIG. 21, line XXIVa-XXIVa of FIG. 23, and line XXVIa-XXVIa of FIG. 25, respectively. FIGS. 20B, 22B, 24B, and 26B are cross-sectional views taken along line XXb-XXb of FIG. 19, line XXIIb-XXIIb of FIG. 21, line XXIVb-XXIVb of FIG. 23, and line XXVIb-XXVIb of FIG. 25, respectively. FIGS. 20C, 22C, 24C, and 26C are cross-sectional views taken along line XXc-XXc of FIG. 19, line XXIIc-XXIIc of FIG. 21, line XXIVc-XXIVc of FIG. 23, and line XXVIc-XXVIc of FIG. 25, respectively. FIGS. 20D, 22D, 24D, and 26D are cross-sectional views taken along line XXd-XXd of FIG. 19, line XXIId-XXIId of FIG. 21, line XXIVd-XXIVd of FIG. 23, and line XXVId-XXVId of FIG. 25, respectively. In FIGS. 19-26D, the same components as those of the first embodiment are indicated by the same reference characters of FIGS. 5-18D. Therefore, in this embodiment, features and elements similar to those of the first embodiment will not be redundantly described.

Firstly, steps similar to those of the first embodiment shown in FIGS. 5, 6A-6D, 7, and 8A-8D are successively performed.

Next, as shown in FIGS. 19 and 20A-20D, the first and second resist patterns Re1 and Re2 are formed on the first and second gate electrodes 18A and 18B by photolithography.

In this case, as shown in FIGS. 20A-20D, the distance s between the first ends of the first and second active regions 10a and 10b, and the protrusion amount d1x from the first end of the first active region 10a to the first end of the first resist pattern Re1, are designed to establish the relationship d1x<0.5s.

The distance s, the protrusion amount d1x, and the distance hx from the first end of the first resist pattern Re1 to the first end of the second resist pattern Re2, are designed to establish the relationship d1x≥0.5(s−hx).

The protrusion amount d1x and the protrusion amount d2x from the first end of the second active region 10b to the first end of the second resist pattern Re2 are designed to establish the relationship d1x<d2x.

The protrusion amount d1x and the protrusion amount d3x from the second end of the first active region 10a to the second end of the first resist pattern Re1 are designed to establish the relationship d3x≤d1x.

The protrusion amount d2x and the protrusion amount d4x from the second end of the second active region 10b to the second end of the second resist pattern Re2 are designed to establish the relationship d4x≤d2x.

The distance s is, for example, about 200 nm. The distance hx is, for example, about 60 nm. The protrusion amount d1x is, for example, about 40 nm. The protrusion amount d2x is, for example, about 100 nm. The protrusion amount d3x is, for example, about 30 nm. The protrusion amount d4x is, for example, about 30 nm.

Next, as shown in FIGS. 21 and 22A-22D, the first and second gate electrodes 18A and 18B and the first and second gate insulating films 13A and 14B are patterned by, for example, etching using the first and second resist patterns Re1 and Re2 as a mask.

The first gate electrode 18A and the first gate insulating film 13A are removed from the first separation region 11L by etching. As a result, the protrusion amount from the first end of the first active region 10a to the first end of the first gate insulating film 13A is reduced, whereby the first and second gate insulating films 13A and 14B are separated from each other on the first separation region 11L.

In addition, the first gate electrode 18A and the first gate insulating film 13A are removed from the second separation region 11M by etching. As a result, the protrusion amount from the second end of the first active region 10a to the second end of the first gate insulating film 13A is reduced.

In addition, the second gate electrode 18B and the second gate insulating film 14B are removed from the third separation region 11N by etching. As a result, the protrusion amount from the second end of the second active region 10b to the second end of the second gate insulating film 14B is reduced.

In this case, the first and second gate electrodes 18A and 18B are separated from each other on the first separation region 11L.

Thereafter, the first and second resist patterns Re1 and Re2 are removed. Thereafter, the n-type extension injection regions 19a are formed in the first active region 10a laterally outside the first gate electrode 18A. On the other hand, the p-type extension injection regions 19b are formed in the second active region 10b laterally outside the second gate electrode 18B.

Figure 22A:
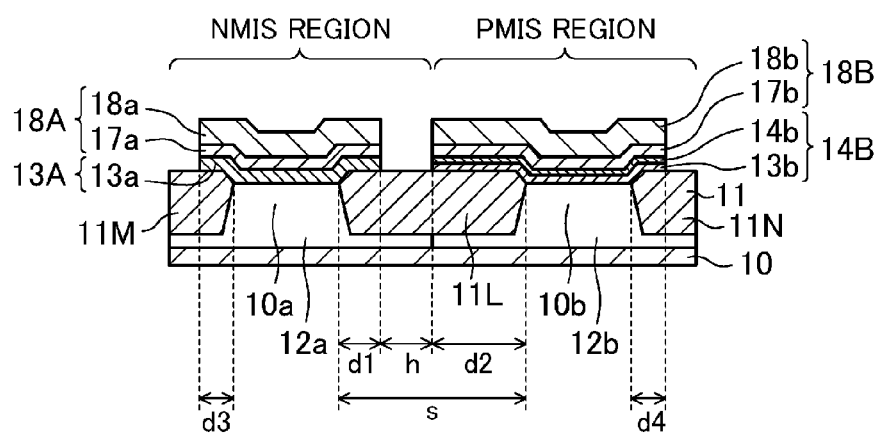
FIGS. 22A-22D are cross-sectional views showing the method for fabricating the semiconductor device of the second embodiment of the present disclosure.
Figure 22B:
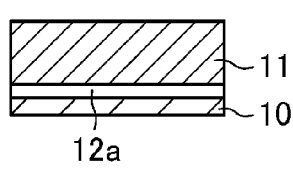
Figure 22C:
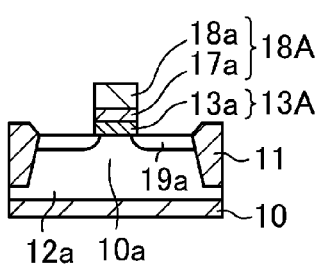
Figure 22D:
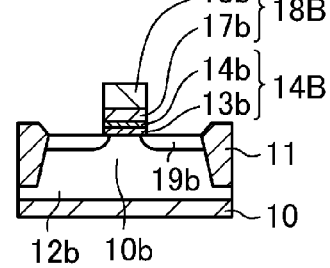
Figure 23:
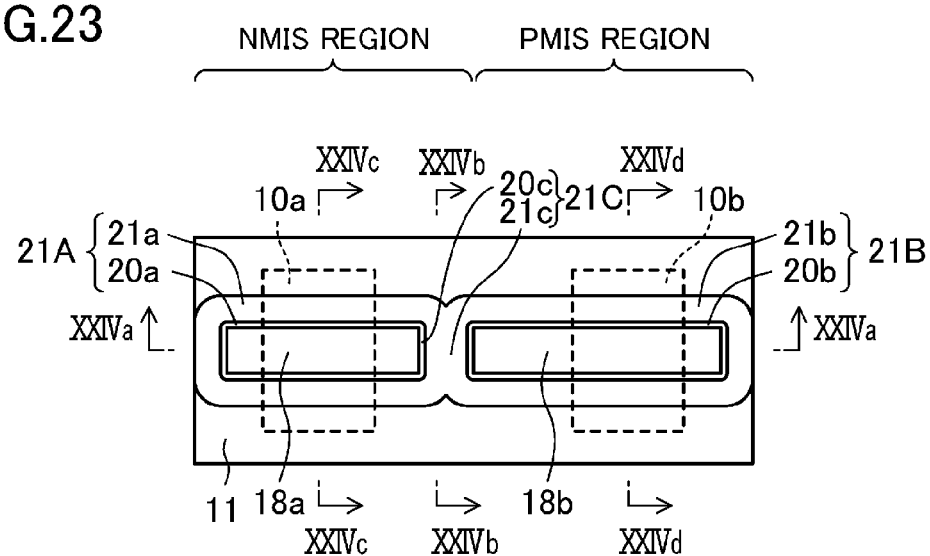
FIG. 23 is a plan view showing the method for fabricating the semiconductor device of the second embodiment of the present disclosure.
Figure 24A:
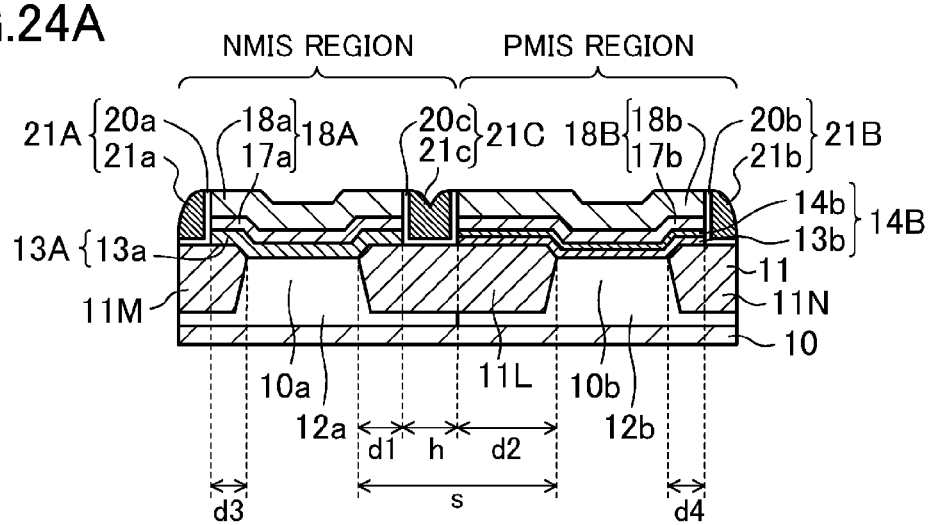
FIGS. 24A-24D are cross-sectional views showing the method for fabricating the semiconductor device of the second embodiment of the present disclosure.
Figure 24B:
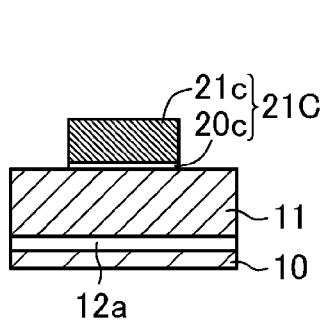
Figure 24C:
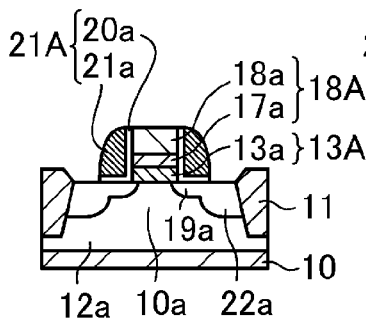
Figure 24D:
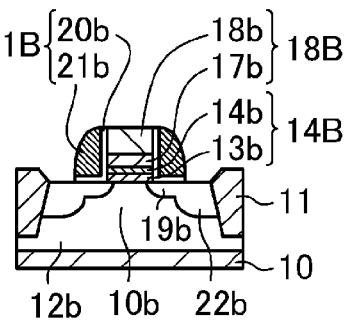

In this case, as shown in FIG. 22A, the distance s between the first ends of the first and second active regions 10a and 10b, and the protrusion amount d1 from the first end of the first active region 10a to the first end of the first gate insulating film 13A, establish the following relationship:

$$d1<0.5s$$

The distance s, the protrusion amount d1, and the distance h between the first end of the first gate insulating film 13A and the first end of the second gate insulating film 14B establish the following relationship:

$$d1 \leq 0.5(s-h)$$

The protrusion amount d1 and the protrusion amount d2 from the first end of the second active region 10b to the first end of the second gate insulating film 14B establish the following relationship:

$$d1<d2$$

The protrusion amount d1 and the protrusion amount d3 from the second end of the first active region 10a to the second end of the first gate insulating film 13A establish the following relationship:

$$d3 \leq d1$$

The protrusion amount d2 and the protrusion amount d4 from the second end of the second active region 10b to the second end of the second gate insulating film 14B establish the following relationship:

$$d4 \leq d2$$

Next, as shown in FIGS. 23 and 24A-24D, an inner sidewall formation film formed of, for example, a silicon oxide film and an outer sidewall formation film formed of, for example, a silicon nitride film are successively formed on an entire surface of the semiconductor substrate 10 by, for example, CVD. Thereafter, for example, anisotropic dry etching is successively performed on the outer and inner sidewall formation films. As a result, the first and second sidewalls 21A and 21B including the first and second inner sidewalls 20a and 20b with an L-shaped cross-section and the first and second outer sidewalls 21a and 21b are formed on the side surfaces of the first and second gate electrodes 18A and 18B. In addition, a sidewall 21C with a U-shaped cross-section including an inner sidewall 20c and an outer sidewall 21c is formed on the first separation region 11L between the first and second gate electrodes 18A and 18B.

Next, as shown in FIGS. 23 and 24A-24D, n-type source/drain injection regions 22a are formed in the first active region 10a laterally outside the first sidewalls 21A. On the other hand, p-type source/drain injection regions 22b are formed in the second active region 10b laterally outside the second sidewalls 21B.

Next, as shown in FIGS. 25 and 26A-26D, a thermal treatment is performed at, for example, 900° C. As a result, n-type and p-type impurities contained in the n-type and p-type extension injection regions 19a and 19b are activated to form the n-type and p-type extension regions 23a and 23b. In addition, n-type and p-type impurities contained in the n-type and p-type source/drain injection regions 22a and 22b are activated to form the n-type and p-type source/drain regions 24a and 24b.

Next, FIG. 25 and FIG. 26A-26D, the first and second silicide films 25a and 25b are formed on the first and second silicon films 18a and 18b. In addition, the third and fourth silicide films 26a and 26b are formed on the n-type and p-type source/drain regions 24a and 24b.

Next, the interlayer insulating film 27 is formed on an entire surface of the semiconductor substrate 10. Thereafter, in the interlayer insulating film 27, the contact hole 28 is formed through which end portions of the first and second gate electrodes 18A and 18B and the sidewall 21C are exposed. Thereafter, a metal film made of a metal material, such as tungsten (W) etc., is buried in the contact hole 28. As a result, the contact plug 29 is formed on the first separation region 11L, covering end portions of the first and second gate electrodes 18A and 18B. The contact plug 29 contacts end portions of the first and second silicide films 25a and 25b.

Thus, the semiconductor device of this embodiment can be fabricated.

The configuration of this embodiment is different from that of the first embodiment in the following points.

In the first embodiment, as shown in FIG. 3, the first sidewalls 21A are formed on the side surfaces in the gate length direction of the first gate electrode 18A, but not on the side surfaces in the gate width direction of the first gate electrode 18A. Similarly, as shown in FIG. 3, the second sidewalls 21B are formed on the side surfaces in the gate length direction of the second gate electrode 18B, but not on the side surfaces in the gate width direction of the second gate electrode 18B. Therefore, as shown in FIG. 4A, the first silicide film 25a is formed on the top surface, and the side surfaces in the gate width direction, of the first gate electrode 18A. Similarly, the second silicide film 25b is formed on the top surface, and the side surfaces in the gate width direction, of the second gate electrode 18B.

Figure 25:
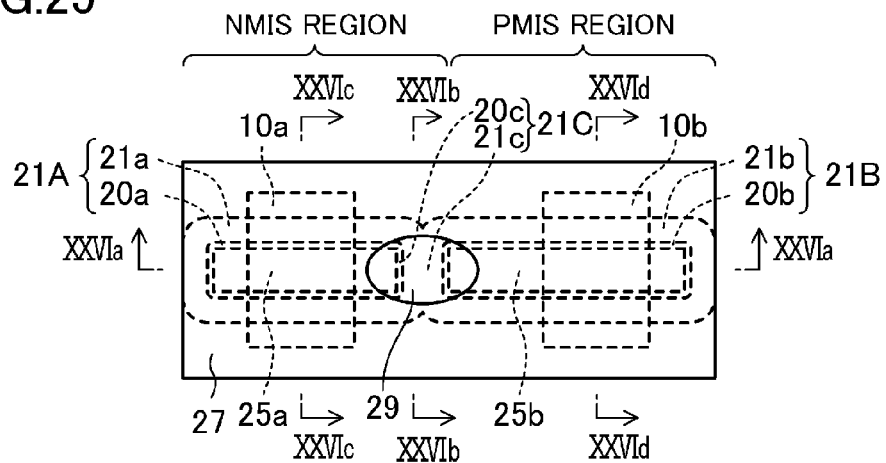
FIG. 25 is a plan view showing the method for fabricating the semiconductor device of the second embodiment of the present disclosure.
Figure 26A:
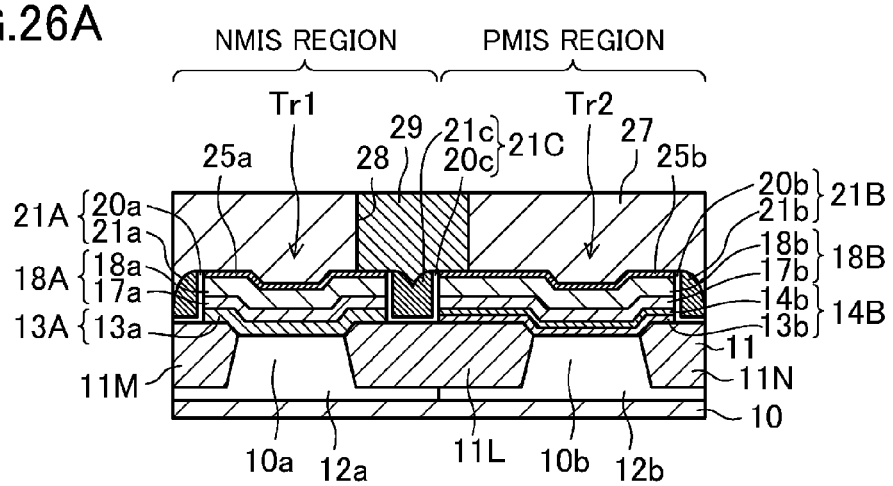
FIGS. 26A-26D are cross-sectional views showing the method for fabricating the semiconductor device of the second embodiment of the present disclosure.
Figure 26B:
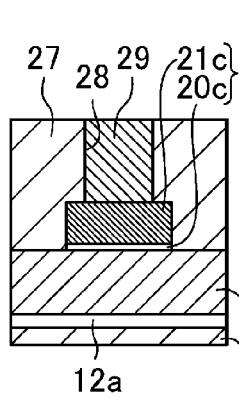
Figure 26C:
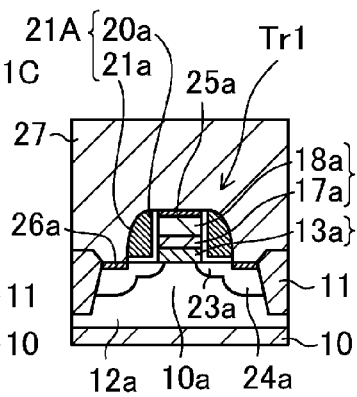
Figure 26D:
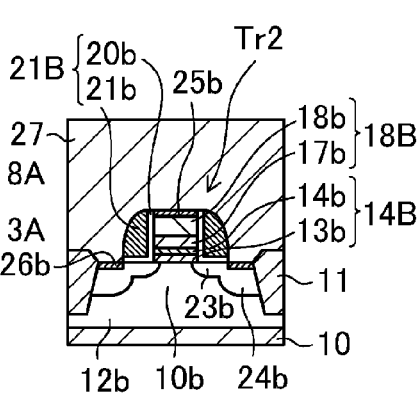

In contrast to this, in this embodiment, as shown in FIG. 25, the first sidewalls 21A are formed on the side surfaces in the gate length direction and the side surfaces in the gate width direction of the first gate electrode 18A. Similarly, as shown in FIG. 25, the second sidewalls 21B are formed on the side surfaces in the gate length direction and the side surfaces in the gate width direction of the second gate electrode 18B. In addition, as shown in FIG. 26A, the sidewall 21C is formed on the first separation region 11L between the first and second gate electrodes 18A and 18B. Therefore, the first silicide film 25a is formed only on the top surface of the first gate electrode 18A. Similarly, the second silicide film 25b is formed only on the top surface of the second gate electrode 18B.

According to this embodiment, advantages similar to those of the first embodiment can be obtained.

Moreover, as shown in FIGS. 21 and 22A-22D, before the formation of the first and second sidewalls 21A and 21B (see FIGS. 23 and 24A-24D), the first and second high-k films 13a and 13b are removed from the first, second, and third separation regions 11L, 11M, and 11N. In other words, unlike the first embodiment in which the removal is performed after the formation of the first and second sidewalls, the removal is performed before the formation of the first and second sidewalls. Therefore, it is possible to reduce or prevent the occurrence of residues of the first and second high-k films 13a and 13b which fail to be removed from the first, second, and third separation regions 11L, 11M, and 11N.

<Variation of Second Embodiment>

Figure 27:
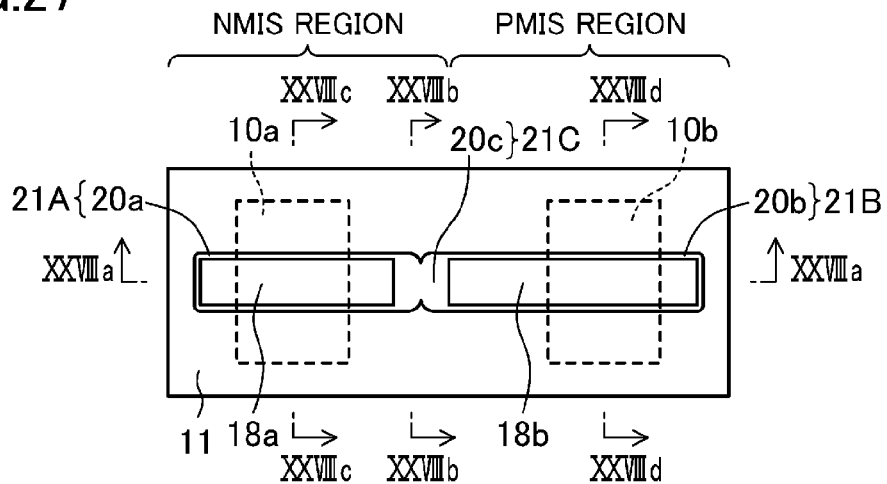
FIG. 27 is a plan view showing a method for fabricating a semiconductor device according to a variation of the second embodiment of the present disclosure.
Figure 28A:
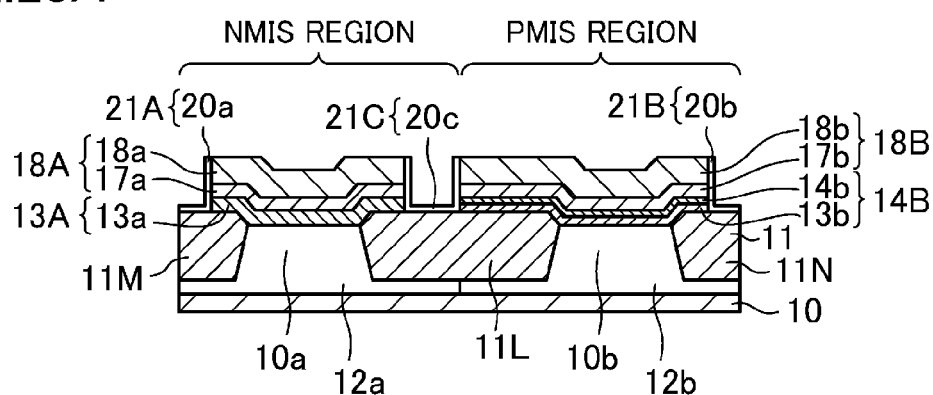
FIGS. 28A-28D are cross-sectional views showing the method for fabricating the semiconductor device of the variation of the second embodiment of the present disclosure.
Figure 28B:
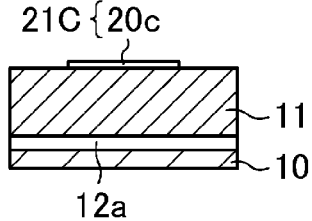
Figure 28C:
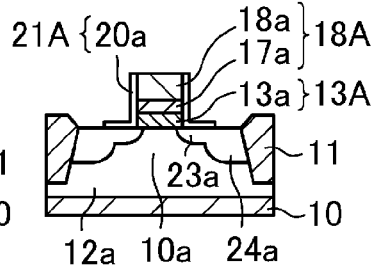
Figure 28D:
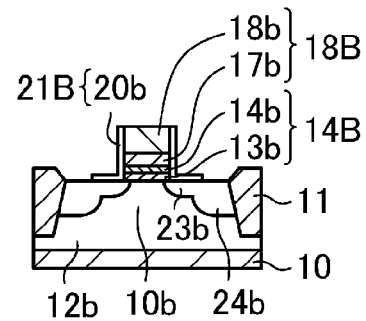
Figure 29:
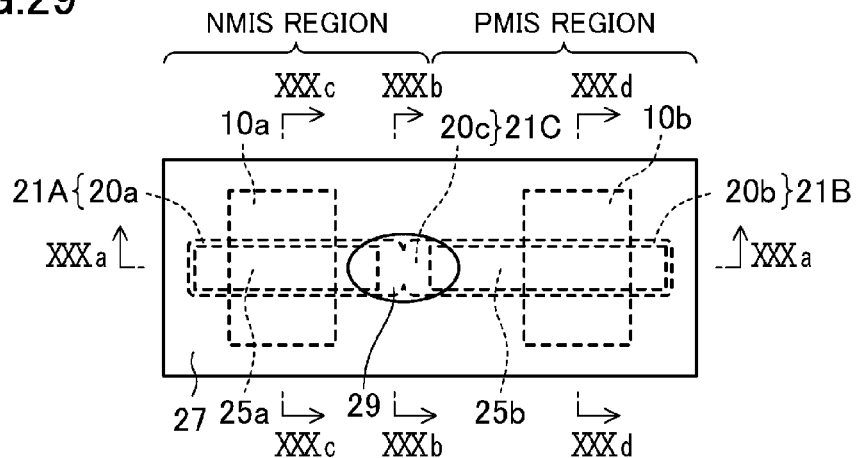
FIG. 29 is a plan view showing the method for fabricating the semiconductor device of the variation of the second embodiment of the present disclosure.
Figure 30A:
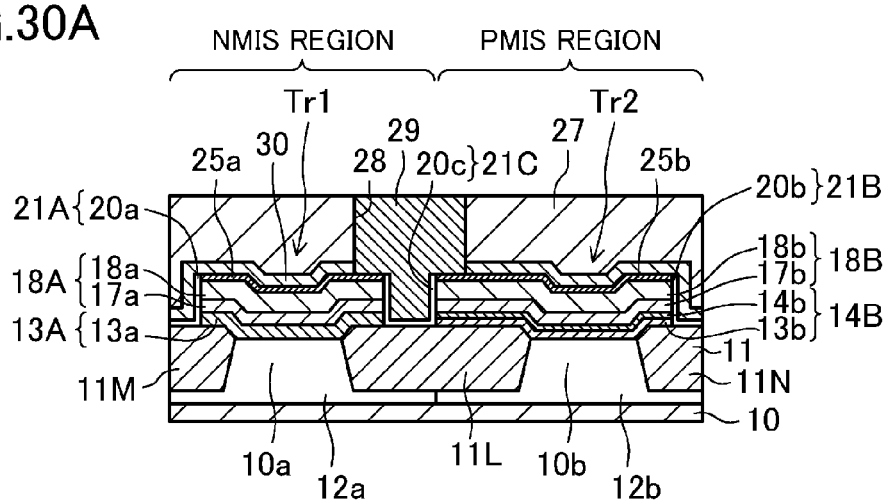
FIGS. 30A-30D are cross-sectional views showing the method for fabricating the semiconductor device of the variation of the second embodiment of the present disclosure.
Figure 30B:
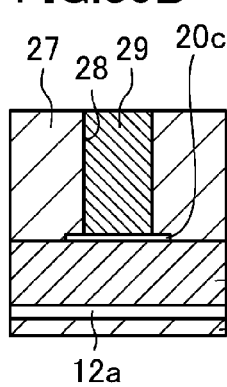
Figure 30C:
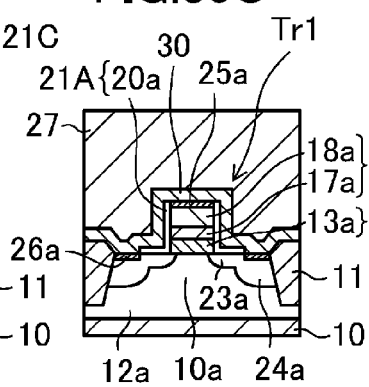
Figure 30D:
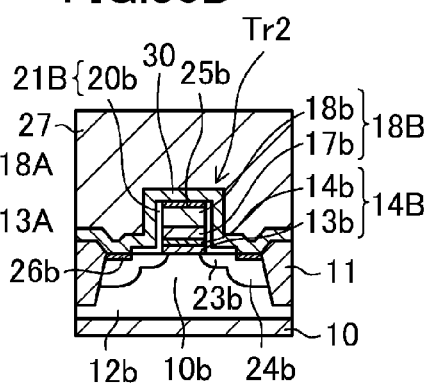
Figure 31:
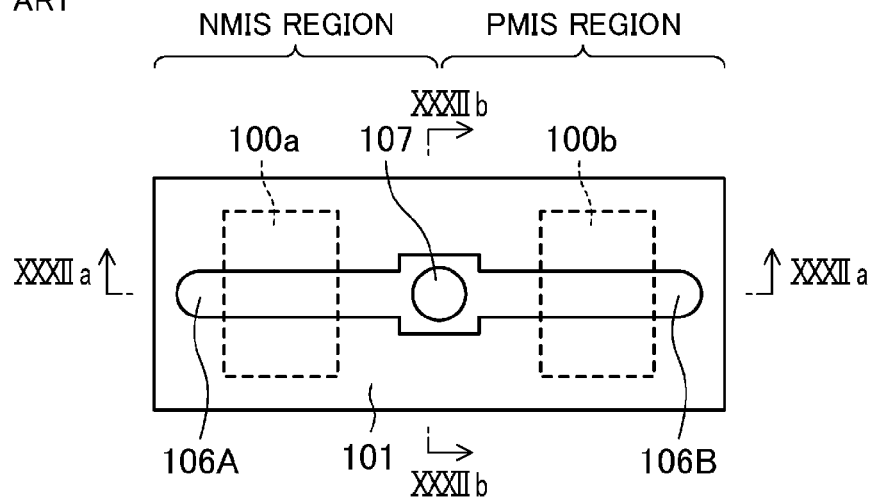
FIG. 31 is a plan view showing a configuration of a conventional semiconductor device.

A method for fabricating a semiconductor device according to a variation of the second embodiment of the present disclosure will be described hereinafter with reference to FIGS. 27, 28A-28D, 29, and 30A-30D. FIGS. 27 and 29 are plan views showing the semiconductor device of the variation of the second embodiment of the present disclosure in the order in which the semiconductor device is fabricated. FIGS. 28A and 30A are cross-sectional views taken along the gate width direction showing the semiconductor device of the variation of the second embodiment of the present disclosure in the order in which the semiconductor device is fabricated. FIGS. 28B-28D and 30B-30D are cross-sectional views taken along the gate length direction showing the semiconductor device of the variation of the second embodiment of the present disclosure in the order in which the semiconductor device is fabricated. Specifically, FIGS. 28A and 30A are cross-sectional views taken along line XXVIIIa-XXVIIIa of FIG. 27 and line XXXa-XXXa of FIG. 29, respectively. FIGS. 28B and 30B are cross-sectional views taken along line XXVIIIb-XXVIIIb of FIG. 27 and line) XXXb-XXXb of FIG. 29, respectively. FIGS. 28C and 30C are cross-sectional views taken along line XXVIIIc-XXVIIIc of FIG. 27 and line XXXc-XXXc of FIG. 29, respectively. FIGS. 28D and 30D are cross-sectional views taken along line XXVIIId-XXVIIId of FIG. 27 and line XXXd-XXXd of FIG. 29, respectively. In FIGS. 27-30D, the same components as those of the second embodiment are indicated by the same reference characters of FIGS. 19-26D. Therefore, in this variation, features and elements similar to those of the second embodiment will not be redundantly described.

Initially, the steps of the first embodiment shown in FIGS. 5, 6A-6D, 7, 8A-8D, 9, and 10A-10D, and the steps of the second embodiment shown in FIGS. 19, 20A-20D, 21, 22A-22D, 23, and 24A-24D are successively performed.

Next, as shown in FIGS. 27 and 28A-28D, a thermal treatment is performed at, for example, 900° C. As a result, n-type and p-type impurities contained in the n-type and p-type extension injection regions are activated to form the n-type and p-type extension regions 23a and 23b. In addition, n-type and p-type impurities contained in the n-type and p-type source/drain injection regions are activated to form the n-type and p-type source/drain regions 24a and 24b.

Next, as shown in FIGS. 27 and 28A-28D, the first and second outer sidewalls 21a and 21b (silicon nitride film) and the outer sidewall 21c (silicon nitride film) are removed by wet etching using, for example, hot phosphonic acid, leaving the first and second inner sidewalls 20a and 20b (silicon oxide film) and the inner sidewall 20c (silicon oxide film).

Next, as FIGS. 29 and 30A-30D, the first and second silicide films 25a and 25b are formed on the first and second silicon films 18a and 18b. In addition, the third and fourth silicide films 26a and 26b are formed on the n-type and p-type source/drain regions 24a and 24b.

Next, a stress insulating film 30 formed of, for example, an SiN film etc. is formed on an entire surface of the semiconductor substrate 10 by, for example, CVD. The stress insulating film 30 causes tensile stress in the gate length direction to the channel region in the first active region 10a.

In this case, the stress insulating film 30 is formed to contact L-shaped curved surfaces of the first and second inner sidewalls 20a and 20b.

Next, the interlayer insulating film 27 is formed on the stress insulating film 30 by, for example, CVD. Thereafter, in the stress insulating film 30 and the interlayer insulating film 27, the contact hole 28 is formed through which end portions of the first and second gate electrodes 18A and 18B and the sidewall 21C are exposed. Thereafter, a metal film made of a metal material, such as tungsten (W) etc., is buried in the contact hole 28. As a result, the contact plug 29 is formed on the first separation region 11L, covering end portions of the first and second gate electrodes 18A and 18B. The contact plug 29 contacts end portions of the first and second silicide films 25a and 25b.

Thus, the semiconductor device of this variation can be fabricated.

According to this variation, advantages similar to those of the second embodiment can be obtained.

In addition, the stress insulating film 30 can apply tensile stress in the gate length direction to the channel region in the first active region 10a, whereby the drive capability of the first MIS transistor Tr1 can be improved.

After the first outer sidewalls 21a are removed as shown in FIGS. 27 and 28A-28D, the stress insulating film 30 is formed as shown in FIGS. 29 and 30A-30D. Therefore, the stress insulating film 30 can be formed to contact the L-shaped curved surfaces of the first inner sidewalls 20a as shown in FIGS. 30A 30C, and 30D. Therefore, the stress insulating film 30 can be formed closer to the channel region in the first active region 10a by an amount corresponding to the removed first outer sidewall 21a. Therefore, tensile stress can be effectively applied in the gate length direction to the channel region in the first active region 10a.

The thickness of the stress insulating film 30 can be increased by an amount corresponding to the removed first outer sidewall 21a. Therefore, tensile stress can be effectively applied in the gate length direction to the channel region in the first active region 10a.

Note that the present disclosure is not intended to be limited to the first embodiment, and the second embodiment and the variation thereof. Various changes and modifications can be made without departing the scope and spirit of the present disclosure.

In the present disclosure, a plurality of expressions indicating the relationship $d1 \leq 0.5(s-h)$ etc. have been described. As used herein, the phrase "the relationship $d1=0.5(s-h)$ is established" means that $d1$ and $0.5(s-h)$ have exactly the same value, and in addition, that $d1$ and $0.5(s-h)$ have substantially the same value. The phrase "substantially the same value" means that although $d1$ and $0.5(s-h)$ are designed to have exactly the same value, $d1$ and $0.5(s-h)$ actually do not have exactly the same value, i.e., a small difference occurs between $d1$ and $0.5(s-h)$, because, for example, a resist pattern is not accurately positioned.

Note that, as described above, according to the present disclosure, the increase in the threshold voltage of a MIS transistor can be reduced or prevented. Therefore, the present disclosure is useful for a semiconductor device which includes a MIS transistor including a gate insulating film including a high-k film containing an adjustment metal, and a method for fabricating the semiconductor device.

What is claimed is:

1. A semiconductor device comprising:
   a first MIS transistor of a first conductivity type; and
   a second MIS transistor of a second conductivity type,
   wherein the first MIS transistor includes:
      a first gate insulating film including a first high dielectric constant film formed on a first active region surrounded by a separation region of a semiconductor substrate, and
      a first gate electrode formed on the first gate insulating film, the second MIS transistor includes:
      a second gate insulating film including a second high dielectric constant film formed on a second active region surrounded by the separation region of the semiconductor substrate, and
      a second gate electrode formed on the second gate insulating film,
   the first and second gate insulating films are separated from each other on a first separation region of the separation region located between the first and second active regions, the first and second active regions are adjacent to each other in a gate width direction with the first separation region being interposed between the first and second active regions, and the following relationship is established:

$$d1 < 0.5s$$

where s is a distance between first ends of the first and second active regions facing each other with the first separation region being interposed between the first ends of the first and second active regions, and d1 is a protrusion amount from the first end of the first active region to a first end of the first gate insulating film located on the first separation region, the first and second gate electrodes are separated from each other on the first separation region, and the semiconductor device further includes a contact plug formed on the first separation region, covering end portions of the first and second gate electrodes.

2. The semiconductor device of claim 1, wherein the following relationship is established:

$$d1 \leq 0.5(s-h)$$

where h is a distance between the first end of the first gate insulating film and a first end of the second gate insulating film located on the first separation region.

3. The semiconductor device of claim 1, wherein the following relationship is established:

$$d1 < d2$$

where d2 is a protrusion amount from the first end of the second active region to a first end of the second gate insulating film located on the first separation region.

4. The semiconductor device of claim 1, wherein the following relationship is established:

$$d3 \leq d1$$

where d3 is a protrusion amount from a second end of the first active region to a second end of the first gate insulating film located on a second separation region of the separation region.

5. The semiconductor device of claim 1, wherein the following relationship is established:

$$d4 \leq d2$$

where d2 is a protrusion amount from the first end of the second active region to a first end of the second gate insulating film located on the first separation region, and d4 is a protrusion amount from a second end of the second active region to a second end of the second gate insulating film located on a third separation region of the separation region.

6. The semiconductor device of claim 1, wherein the first MIS transistor is an n-type MIS transistor, and the second MIS transistor is a p-type MIS transistor.

7. The semiconductor device of claim 1, wherein the first gate insulating film contains a first adjustment metal, and the second gate insulating film does not contain the first adjustment metal.

8. The semiconductor device of claim 7, wherein the first adjustment metal is La.

9. The semiconductor device of claim 1, wherein the second gate insulating film contains a second adjustment metal, and the first gate insulating film does not contain the second adjustment metal.

10. The semiconductor device of claim 9, wherein the second adjustment metal is Al.

11. The semiconductor device of claim 1, wherein
the first gate electrode includes a first metal film formed on the first gate insulating film, and a first silicon film formed on the first metal film, and
the second gate electrode includes a second metal film formed on the second gate insulating film, and a second silicon film formed on the second metal film.

12. The semiconductor device of claim 1, further comprising:
a first sidewall formed on a side surface in a gate length direction of the first gate electrode; and
a second sidewall formed on a side surface in the gate length direction of the second gate electrode,
wherein the first sidewall is not formed on a side surface in the gate width direction of the first gate electrode, and
the second sidewall is not formed on a side surface in the gate width direction of the second gate electrode.

13. The semiconductor device of claim 1, further comprising:
a sidewall having a U-shaped cross-section formed on the first separation region between the first and second gate electrodes.

* * * * *